United States Patent [19]
Hayashi

[11] Patent Number: 5,643,837
[45] Date of Patent: Jul. 1, 1997

[54] METHOD OF FLATTENING THE SURFACE OF A SEMICONDUCTOR DEVICE BY POLISHING

[75] Inventor: Yoshihiro Hayashi, Tokyo, Japan

[73] Assignee: NEC Corporation, Tokyo, Japan

[21] Appl. No.: 445,222

[22] Filed: May 18, 1995

Related U.S. Application Data

[62] Division of Ser. No. 34,167, Mar. 17, 1993, abandoned.

[30] Foreign Application Priority Data

Apr. 15, 1992 [JP] Japan ................................. 4-094677

[51] Int. Cl.⁶ .................................................. H01L 21/304
[52] U.S. Cl. ........................ 437/228; 156/636.1; 216/38; 216/88
[58] Field of Search .......................... 437/228, 195; 156/636.1, 645.1; 216/38, 52, 53, 88, 89

[56] References Cited

U.S. PATENT DOCUMENTS

| | | | |
|---|---|---|---|
| 3,990,925 | 11/1976 | Erdman et al. | 156/645.1 |
| 4,671,851 | 6/1987 | Beyer et al. . | |
| 4,735,679 | 4/1988 | Lasky . | |
| 4,946,550 | 8/1990 | Van Laarhoven | 216/38 |
| 5,032,544 | 7/1991 | Ito et al. | 437/228 |
| 5,094,972 | 3/1992 | Pierce et al. | 437/228 |
| 5,162,254 | 11/1992 | Usui et al. | 437/63 |
| 5,173,439 | 12/1992 | Dash et al. . | |
| 5,204,280 | 4/1993 | Dhong et al. | 437/228 |
| 5,246,884 | 9/1993 | Jaso et al. . | |
| 5,262,346 | 11/1993 | Bindal et al. | 156/636.1 |
| 5,264,395 | 11/1993 | Bindal et al. | 437/228 |
| 5,272,117 | 12/1993 | Roth et al. . | |
| 5,314,843 | 5/1994 | Yu et al. . | |
| 5,334,281 | 8/1994 | Doerre et al. | 156/636.1 |
| 5,399,233 | 3/1995 | Murazumi et al. | 437/228 |

FOREIGN PATENT DOCUMENTS

| | | | |
|---|---|---|---|
| 0341898 | 11/1989 | European Pat. Off. . | |
| 1-136328 | 5/1989 | Japan | 156/636.1 |
| 1-216537 | 8/1989 | Japan | 156/645.1 |
| 2-237066 | 9/1990 | Japan . | |
| 2-271617 | 11/1990 | Japan | 437/228 |
| 3-104224 | 5/1991 | Japan | 156/636.1 |
| 3-108356 | 5/1991 | Japan . | |

OTHER PUBLICATIONS

"Planarization Process Using Spin–On–Glass and Polishing", *Research Disclosure*, 32635, Jun., 1991, p. 404.

"Chemical Vapor Deposited Device Isolated with Chemical/Mechanical Planarization", *IBM Technical Disclosure Bulletin*, vol. 29, No. 2, Jul. 1986, pp. 577–579.

Beyer, K. et al., "Glass Planarization by Stop–Layer Polishing", *IBM Technical Disclosure Bulletin*, vol. 27, No. 8, Jan., 1985, pp. 4700–4701.

Kern, W., et al., "Borophosphosilicate Glasses for Integrated Circuits", *Solid State Technology*, Jun., 1985, pp. 171–179.

Stillwagon, L., et al., "Planarization of Substrate Topography by Spin Catalog", *Journal of Electrochemical Society*, vol. 134, No. 8, Aug., 1987, pp. 2030–2037.

Lindenberger, W., et al., "Submicron Mechanically Planarized Shallow Trench Isolation with Field Shield", *1991 VLSI Technology Symposium Technical Digest*, pp. 89–90.

(List continued on next page.)

*Primary Examiner*—Charles L. Bowers, Jr.
*Assistant Examiner*—Leon Radomsky
*Attorney, Agent, or Firm*—Young & Thompson

[57] ABSTRACT

A $Si_3N_4$ film is formed as a protective film over a BPSG film. The film thickness of the $Si_3N_4$ film is determined by the relation of the working rate of the BPSG film to the working rate of the $Si_3N_4$ film and the height of the convex portions on the surface of the BPSG film. The $Si_3N_4$ film formed over the convex portions is then removed over areas slightly larger than the convex portions such that the film does not overlie the convex portions. When the silicon substrate is subsequently polished through the use of colloidal silica slurry, the convex portions can be selectively removed by polishing while the surface of the BPSG film is protected by the $Si_3N_4$ film.

12 Claims, 18 Drawing Sheets

OTHER PUBLICATIONS

Davari, B., et al., "A New Planarization Technique, Using a Combination and Chemical Mechanical Polish (CMP)", *1989 IEDM Technical Digest,* 1989, IEEE, pp. 61–64.

Uttecht, R., et al., "A Four–Level–Metal Fully Planarized Interconnect Technology for Dense High Perfromance Logic and SRAM Applications", *1991 VMIC Conference,* IEEE, pp. 20–26.

Research Disclosure #32635, Jun. 1991, p. 404 "Planarization Process Using SOG and Polishing".

A. Bindal et al., Thin Solid Films, 232 (1993) 105 "SOI For Fully Depleted CMOS . . . ".

METHOD OF FLATTENING THE SURFACE OF A SEMICONDUCTOR DEVICE BY POLISHING

This application is a division of application Ser. No. 08/034,167, filed Mar. 17, 1993, abandoned.

BACKGROUND OF THE INVENTION

The present invention relates to a method of flattening the surface of a semiconductor device by polishing through the use of colloidal silica slurry.

In recent years, as the miniaturization of semiconductor elements constituting semiconductor integrated circuits proceeds, it has become necessary to form patterns with a dimension of 1 μm or less. For example, in order to form aluminum wiring patterns with a pattern width of 0.4 μm to construct a 64 Mb DRAM, a photolithography process including the following steps using a reduction projection exposure apparatus is performed:

(a) A step in which an aluminum film is grown over the entire area of a silicon substrate using sputtering equipment;

(b) A step in which, after applying resist to the aluminum film, the aluminum film is exposed to light using I-radiation reduction projection exposure equipment (wavelength=365 nm);

(c) A step in which a resist pattern 0.4 μm wide is formed by developing; and (d) A step in which the aluminum film is etched by dry etching using the resist pattern as a mask to form the aluminum wiring patterns.

The practical resolution R of the resist pattern obtained by the photolithography process using the reduction projection exposure equipment and the focus margin M for an offset on the surface to be exposed are given by equations (1) and (2), respectively:

$$R = 0.6 \times \lambda / NA \quad (1)$$

$$M = 0.5 \times \lambda / NA^2 \quad (2)$$

"NA" is the aperture value of the optical system, and "λ" is the wavelength of light used for exposure. From equation (1), since the practical resolution R of the resist pattern increases in proportion to the wavelength λ of light used for exposure but increases in reverse proportion to the aperture value NA of the optical system, in order to form a fine resist pattern, it is necessary to employ a light source having a shorter wavelength and employ an optical system having a higher aperture value. However, from equation (2), since the focus margin M for the offset on the surface to be exposed increases in reverse proportion to the square of the aperture value NA of the optical system, as the aperture value NA of the optical system increases, the focus margin M for the offset on the surface to be exposed decreases sharply. As a result, since the surface of an actual semiconductor device has various offsets of different sizes and different heights depending upon underlying patterns such as aluminum wiring patterns, when the focus margin M decreases, it becomes difficult to form another fine resist pattern over the underlying patterns. Further, though not described in detail here, as the miniaturization proceeds, it becomes increasingly difficult to etch by dry etching a thin film (for example, a sputtered aluminum film) formed on a steep offset which has an edge having a shape similar to a vertical wall. In this manner, the reduction of offsets existing on the surface of a semiconductor device in which various underlying patterns are formed over the semiconductor substrate (that is, flattening the surface of the semiconductor device) becomes a significant subject as the miniaturization proceeds from a 64 Mb DRAM to a 256 Mb DRAM and further to a 1 Gb DRAM.

Thus, a reflow flattening method and an etching back flattening method, the typical flattening methods of the prior art for the surface of a semiconductor device, are first described briefly, following which a prior art flattening polishing method which is specifically related to the present invention is described in detail.

(A) Reflow Flattening Method

In a flattening process in which a BPSG (Boro-phosphosilicate Glass) film is employed as a reflow film, a BPSG film 4 is formed on underlying convex patterns 2 such as polycrystalline silicon stacked capacitor patterns shown in FIG. 1. The growth of the BPSG film 4 is performed in most cases by the atmospheric pressure CVD method using ozone ($O_3$)—tetramethoxysilane (TEOS)—trimethylphosphate (TMP)—trimethylborate (TMB) as gas sources because it is superior in step coverage (Numazawa et al., Monthly Semiconductor World, November, 1989, pp. 74–77). Thereafter, the BPSG film 4 is heated to about 900° C. and reflowed as shown in FIG. 2. The mechanism by which the BPSG film 4 is reflowed at high temperature is explained by the phenomenon of mass transfer in which offsets on the surface of the BPSG film 4 are flattened so that the surface free energy may be minimized (W. Kern et al., Solid State Technology, June, 1985, pp. 171–179).

The most significant advantage of the reflow flattening method is that the process is easy. However, since a high-temperature heat treatment is necessary in order to reach reflow conditions, when the miniaturization proceeds to the deep submicron order, there may be an adverse influence on the characteristics of transistors existing in a layer below the BPSG film 4. Further, the reflow flattening method naturally cannot be applied as the method of flattening the surface of an interlayer insulating film when multilayer metal wiring lines are formed over a semiconductor substrate. Furthermore, although the surface in an area R shown in the central portion of FIG. 2 in which the underlying convex patterns 2 are concentrated can be flattened, an offset at a boundary location between the area R and a perimetric area in which no underlying convex pattern 2 exists or an offset formed by an isolated underlying convex pattern 2' shown at the right end in FIG. 2 cannot be removed effectively. As a result, a height h of the offsets after the reflow shown in FIG. 2 is substantially equal to a height $h_O$ of the initial offsets shown in FIG. 1.

(B) Etching Back Flattening Method

The etching back flattening method makes use of the transfer of a smooth surface topology of an applied film applied over a semiconductor substrate by spin coating (Nikkei Microdevice, June, 1988, pp. 33–46). According to the etching back flattening method, as shown in FIG. 3, a silicon oxide film 13 is formed by the CVD method over underlying convex patterns 12 such as aluminum wiring patterns which are formed over a device layer 11. Thereafter, as shown in FIG. 4, an applied film 19 such as a resist or spin-on-glass (SOG) having sufficiently smooth surface topology to moderate offsets present on the surface of the silicon oxide film 13 is formed on the silicon oxide film 13 by the spin coating (L. E. Stillwagon et al., Journal of Electrochemical Society, Vol. 134, No. 8, p. 2030, 1987). Thereafter, the silicon oxide film 13 and the applied film 19 are etched by dry etching under the conditions of an etching gas which equalizes the etching rate of the silicon oxide film 13 and the applied film 19. As a result, the smooth surface topology of the applied film 19 is transferred to the surface of the silicon oxide film 13 as shown in FIG. 5.

Since the etching back flattening method does not require a high-temperature heat treatment, it is advantageous in that it can also be applied as a method for flattening the surface of an interlayer insulating film when multilayer metal wiring lines are to be formed over a semiconductor device. With the etching back flattening method, however, since the silicon oxide film 13 and the applied film 19 are etched simultaneously, the ratio between the thickness of the silicon oxide film 13 and the thickness of the applied film 19 always varies for a time immediately after starting the etching and immediately before ending the etching. Accordingly, the etching back flattening method has a problem in that it is difficult to always select the conditions of the etching gas which will equalize the etching rates of the silicon oxide film 13 and the applied film 19. Further, even if the etching back flattening method is used, an offset at a boundary location between an area R at the central portion of FIG. 3 in which the underlying convex patterns 12 are concentrated and a perimetric area in which no underlying convex pattern 12 is present or an offset formed by an isolated underlying convex pattern 12' cannot be removed effectively, and problems similar to those encountered in the reflow flattening method described above cannot be solved. As a result, the offsets of height h substantially equal to height $h_O$ of the initial offsets shown in FIG. 3 remain.

(C) Flattening Polishing Method

As described above, when the surface fluidity of a BPSG film or a spin coated film is utilized as in the reflow flattening method or the etching back flattening method, an offset at a boundary location between an area in which underlying convex patterns are concentrated and a perimetric area in which no underlying convex pattern is present or an offset formed by an isolated underlying convex pattern cannot be removed effectively. In other words, in order to flatten the entire surface of a semiconductor device, the only remaining method is to mechanically polish the surface of the semiconductor device to remove all convex patterns present on the surface of the semiconductor device. The widely known polishing techniques involve embedding an oxide film in a recessed portion of the surface of a silicon device (W. S. Liudenberger et al., 1991 VLSI Technology Symposium Technical Digest, p. 89, and Davari et al., IEDM Technical Digest, IEEE, pp. 61–64, 1989), as represented by the mirror surface processing technique for a silicon device through the use of colloidal silica slurry (Arno Henry Haazok et al., Japanese Patent Application No. 1974-13665) or the trench element separate embedded oxide film layer formation.

However, in recent years, an attempt to apply a polishing technique to flattening convex patterns present on the surface of an interlayer insulating layer has been reported (R. R. Uttecht et al., Proc. 1991 IEEE VMIC Conference, pp. 20–26, 1991). According to this method, metal wiring patterns 28 are formed over a silicon substrate 20 as shown in FIG. 6A. Thereafter, an oxide film 29 is grown over the metal wiring patterns 28 by the plasma CVD method as shown in FIG. 6B. In this instance, since the metal wiring patterns 28 are present, convex portions 25 are produced on the surface of the oxide film 29. The surface of the oxide film 29 is pressed under a load against a rotary polishing surface block on which a polishing pad is applied while colloidal silica slurry used as working liquid is dropped onto the surface of the oxide film 29. In this instance, since the working pressure at the convex portions 25 is locally higher than that at a flat portion, the working rate at the convex portions 25 is relatively high. As a result, the convex portions 25 are scraped so that the surface of the oxide film 29 is flattened. Thereafter, via holes 21 are formed in the oxide film 29 as shown in FIG. 6C, and then, new metal wiring patterns are formed over the oxide film 29.

In this manner, the widely known conventional flattening polishing method involves the mechanical removal of convex portions existing on the surface of an insulating film. Further, since the flattening polishing method is a low-temperature process which requires no high-temperature heat treatment, it can be applied also as a flattening method for an interlayer insulating film when multilayer metal wiring patterns are to be formed over a semiconductor substrate. Accordingly, the most significant advantage of the flattening polishing method is in that it is a comparatively inexpensive and easy process which requires neither dry etching equipment nor achievement of severe etching conditions.

However, as described below, the conventional flattening polishing method is subject to three limitations: a pattern size dependency of flattening working characteristics, a dispersion in a working amount of a substrate in its plane, and a metal pollution to a device layer.

First Subject: Pattern Size Dependency of Flattening Working Characteristics

Flattening the surface of an insulating film by polishing makes use of the phenomenon that the working pressure locally increases at a convex portion existing on the surface of an insulating film. For example, where a plurality of metal wiring patterns 38 having an equal width are formed over a silicon substrate 30 with a device layer 31 interposed therebetween as shown in FIG. 7A, when an oxide film 39 formed over the metal wiring patterns 38 is polished, the first working rate $V_P$ at convex portions 35 of the oxide film 39 is higher than the second working rate $V_O$ at other portions of the oxide film 39 at which no convex portion 35 exists. Consequently, the surface of the oxide film 39 is gradually flattened uniformly as shown in FIG. 7B. In the conventional flattening polishing method, it must be noted that the portion of the oxide film 39 on which no convex portion 35 is present is also removed at the second working rate $V_O$ and that the time required for flattening the convex portions 35 on the surface of the oxide film 39 depends upon the relative working rate $V_P/V_O$ of the first working rate $V_P$ to the second working rate $V_O$. In other words, it should be noted that, as the relative working rate $V_P/V_O$ increases, the convex portions 35 are removed in a shorter time by polishing to make the surface of the oxide film 39 smooth.

However, the relative working rate $V_P/V_O$ depends upon the size of the convex portions 35. For example, an experiment in which a BPSG film formed over striped polycrystalline silicon patterns 5,000 Å high and 1 to 25 μm wide was polished through the use of colloidal silica slurry proved that the relative working rate $V_P/V_O$ has a dependency upon the width L of the convex portions 35 as shown in FIG. 8. In particular, the relative working rate $V_P/V_O$ decreases as the width L of the convex portions 35 increases. According to the results of the experiment shown in FIG. 8, $(V_P/V_O-1)$ increases in proportion to $L^{0.33}$, and consequently, if the relative working rate $V_P/V_O$ is 20 when, for example, the width L of the convex portions 35 is 1 μm, the relative working rate $V_P/V_O$ will decrease to 10 when the width L of the convex portions 35 increases to 10 μm, and the relative working rate $V_P/V_O$ will decrease to approximately 3 when the width L of the convex portions 35 increases to 500 μm.

The fact that the relative working rate $V_P/V_O$ depends upon the size of the convex portions 35 means that the surface flattening rate by polishing depends upon the size of the convex portions 35. In particular, when first to third metal wiring patterns $38_1$–$38_3$ having different widths are formed over the silicon substrate 30 with a device layer 31 interposed therebetween as shown in FIG. 9A, first to third convex portions $35_1$–$35_3$ having different widths are also produced on the oxide film 39 formed over the first to third metal wiring patterns $38_1$–$38_3$. A relationship of $V_O<V_3<V_2<V_1$ holds where $V_O$ represents the working rate at portions of the oxide film 39 at which the first to third convex portions $35_1$–$35_3$ are not present and $V_1$, $V_2$ and $V_3$ represent the working rates at the portions of the oxide film 39 at which the first to third convex portions $35_1$–$35_3$ are produced, respectively. Accordingly, even if the portion of the oxide film 39 at the first convex portion $35_1$ is flattened as shown in FIG. 9B after the passage of a time $t_1$ after starting working, the portions of the oxide film 39 at the second and third convex portions $35_2$, $35_3$ will remain unflattened and offsets will still remain on the oxide film 39. If the working is continued in order to flatten all of the portions of the oxide film 39 at the second and third convex portions $35_2$, $35_3$, the oxide film 39 will removed entirely at the portion of the oxide film 39 at the first convex portion $35_1$, exposing the first metal wiring pattern $38_1$ as shown in FIG. 9C. Accordingly, the conventional flattening polishing method has a problem in that the optimization of the working time is very difficult where convex portions of various sizes are present, as is the actual case for the surface of a semiconductor device in which semiconductor integrated circuits are formed over a semiconductor substrate.

In addition, because the efficiency in flattening decreases as the size of the convex portions 35 increases, problems are encountered in practical use. For example, a 64 Mb DRAM has a structure wherein a memory cell area $R_{memory}$ about 460 μm wide and a perimetric circuit area $R_{perimeter}$ about 50 μm wide are repeated regularly. As shown in FIG. 10, stacked capacitor cells 45 approximately 5,000 to 8,000 Å high are formed in a concentrated manner in the memory cell area $R_{memory}$ while such elements as capacitor plate wiring lines and sense amplifiers are formed in the perimetric circuit area $R_{perimeter}$. In the 64 Mb DRAM having the construction described above, if a BPSG film 44 is grown and reflowed, the surface of the BPSG film 44 will be flattened in both the memory cell area $R_{memory}$ and the perimetric circuit area $R_{perimeter}$, but the entire memory cell area $R_{memory}$ will exhibit a smoothly swollen condition with respect to the perimetric circuit area $R_{perimeter}$. The large offset h between the memory cell area $R_{memory}$ and the perimetric circuit area $R_{perimeter}$ after a reflow condition has been entered complicates the formation of an aluminum wiring pattern on the BPSG film 44. Incidentally, even if an attempt is made to remove the initial offset $h_O$ by the conventional flattening polishing method, since the convex region in the memory cell area $R_{memory}$ is large, the relative working rate $V_{memory}/V_{perimeter}$ of the working rate $V_{memory}$ in the memory cell area $R_{memory}$ to the working rate $V_{perimeter}$ in the flattened perimetric circuit area $R_{perimeter}$ will not reach a high level, preventing the efficient removal of the initial offset $h_O$. Further, if the working is continued, the film thickness $h_{BP}'$ of the BPSG film 44 in the perimetric circuit area $R_{perimeter}$ after a reflow condition has been entered may possibly be decreased excessively.

Since flattening of the surface of an oxide film by polishing depends in this way upon the local distribution of the working pressure corresponding to the unevenness of the surface of the oxide film, the conventional flattening polishing method has a serious problem in that the surface flattening rate decreases as the size of a convex portion increases and it is difficult to flatten the entire surface area of the semiconductor device in which semiconductor integrated circuits constituted from patterns of various sizes are formed over a semiconductor substrate.

Second Subject: Dispersion in Working Amount of Substrate in Its Plane

The conventional flattening polishing method employing colloidal silica slurry commonly provides a working rate distribution in which the working rate in a peripheral portion of a wafer is higher by 5 to 10% than the working rate at a central portion of the wafer. For example, when polishing a BPSG film 54 formed over a silicon substrate 50 with a device layer 51 interposed therebetween and having initial thickness $t_O$ as shown in FIG. 11, the film thickness $t_{perimeter}$ of the BPSG film 54 in the perimetric area $R_{perimeter}$ will become thinner than the film thickness $t_{center}$ of the BPSG film 54 in the central area $R_{center}$. An offset present in the perimetric area $R_{perimeter}$ will naturally also become thinner than another offset present in the central area $R_{center}$. In this manner, with the conventional flattening polishing method, a substrate in-plane distribution is naturally caused in the film thickness of the BPSG film 54 and the offsets on the surface of the BPSG film 54 which complicates the dry etching for formation of contact holes after polishing. In particular, the dispersion of the working amount of a silicon substrate in its plane and the dispersion of the flattening efficiency create problems which become increasingly significant in practical use as the diameter of a silicon substrate used increases.

Third Subject: Metal Pollution of the Device Layer

When the mirror surface polishing is performed through the use of colloidal silica slurry for a semiconductor device in which no device layer is formed over a silicon substrate, the metal pollution of the silicon substrate can be fully eliminated, even for cases in which alkali metal or transition metal is contained in the particles of the colloidal silica or in the medium in which the colloidal silica particles are dispersed, by etching the surface of the semiconductor device by several μm after polishing. Generally, a very small amount (several ppm or so) of Na is contained in the colloidal silica particles or in a medium in which the colloidal silica particles are dispersed. However, when polishing is employed to flatten the surface of an interlayer insulating film before forming an overlying layer of metal wiring lines, there is a danger of excessively reducing the thickness of the interlayer insulating film. Excessive reduction of the thickness of this film may allow alkali metal or transition metal to penetrate the interlayer insulating film and shift the threshold voltage of a MOSFET in the device layer. A gettering layer may be employed to block polluting substances such as Na when forming the interlayer insulating layer, but the conventional flattening polishing method does not take this factor into consideration at all.

SUMMARY OF THE INVENTION

An object of the present invention is therefore to provide a flattening polishing method which can eliminate the dependency of the flattening characteristics on the pattern size, can eliminate the dispersion of the working force across the plane of a substrate and can eliminate the dispersion of metal solution to a device layer.

Other objects of the present invention will become obvious from the following description.

In accordance with an aspect of the present invention, there is provided a method of flattening the surface of a semiconductor device comprising: a first step of forming an insulating film over underlying convex patterns which are formed over a semiconductor substrate; a second step of covering areas of the insulating film other than convex portions which are produced by the underlying convex patterns with a protective film which is lower in polishing rate than the insulating film and is thinner than the height of the convex portions; and a third step of polishing the surface of the insulating film.

BRIEF DESCRIPTION OF THE DRAWINGS

The features and advantages of the present invention will become apparent from the following description when taken in conjunction with the accompanying drawings in which.

DESCRIPTION OF THE PREFERRED EMBODIMENTS

Figure 1:
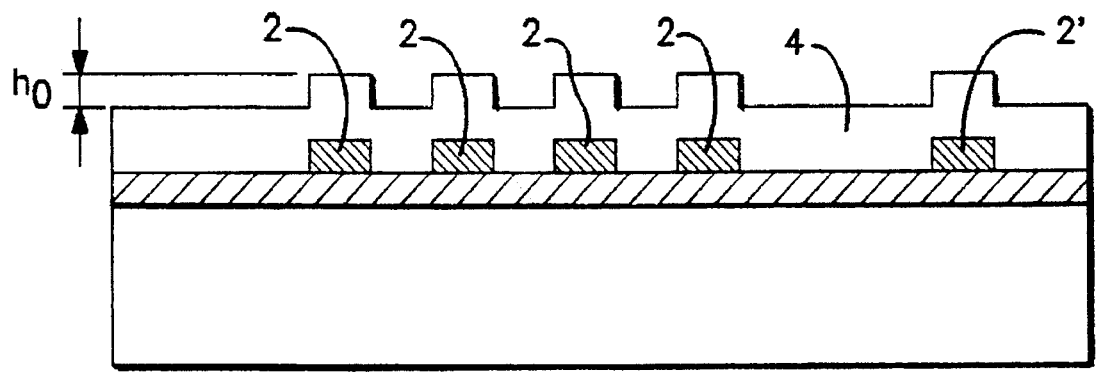
FIGS. 1 and 2 are prior art schematic sectional views illustrating a flattening process when a BPSG film is formed as a reflow film.
Figure 2:
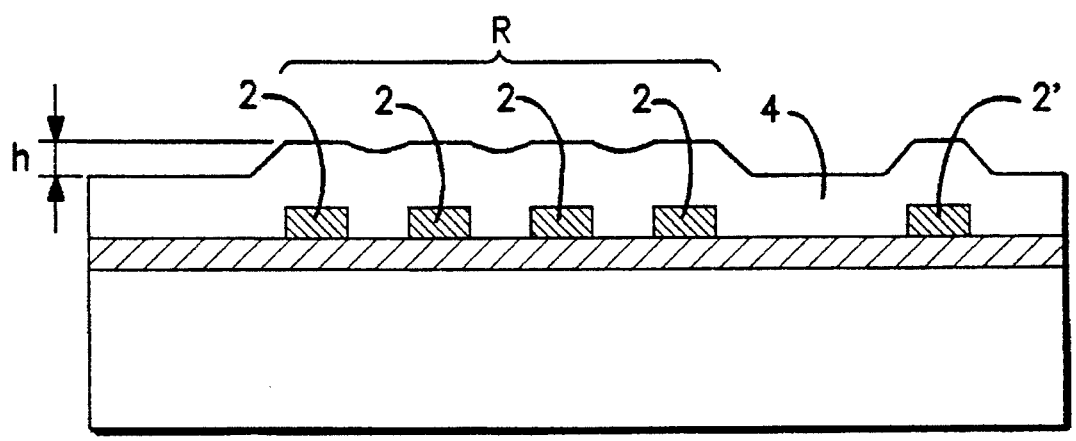
Figure 3:
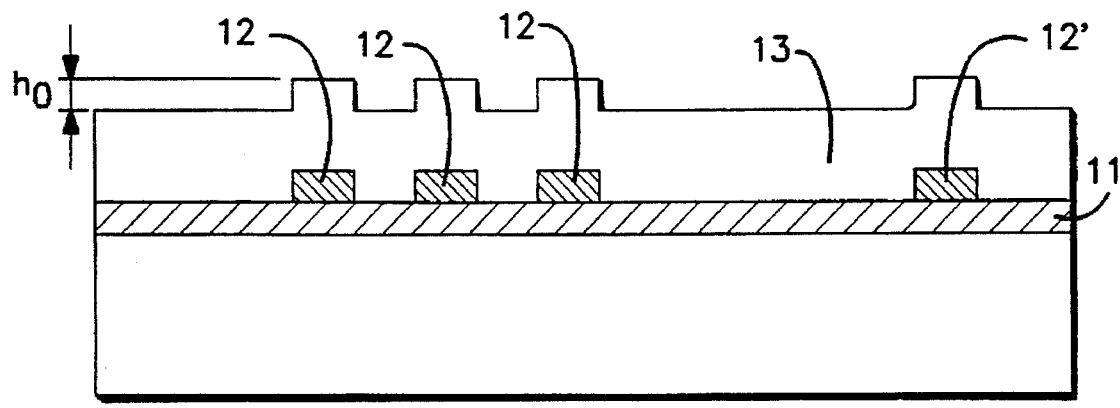
FIGS. 3 to 5 are schematic sectional views illustrating a flattening process based on the etching back method.
Figure 4:
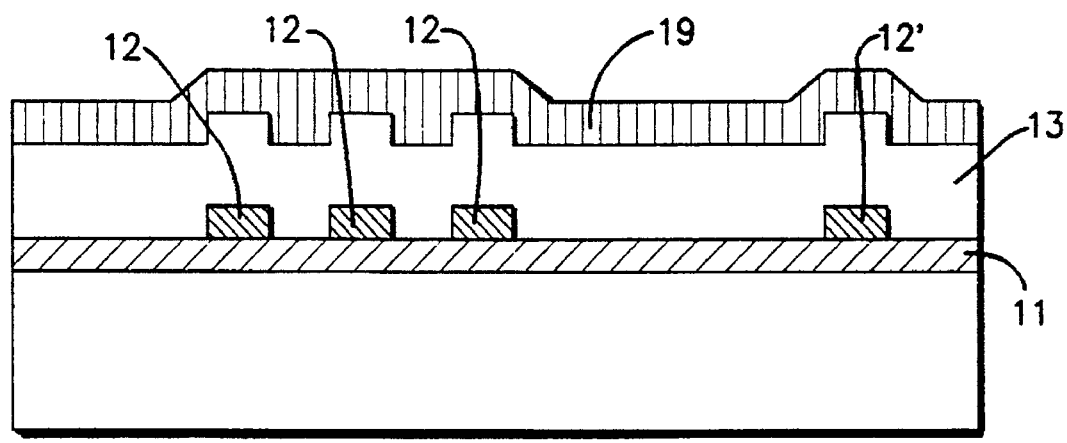
Figure 5:
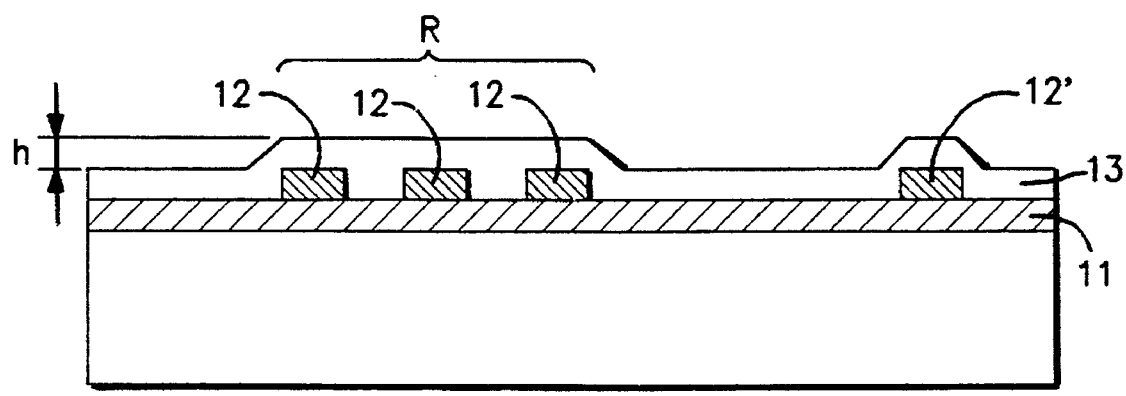
Figure 6A:
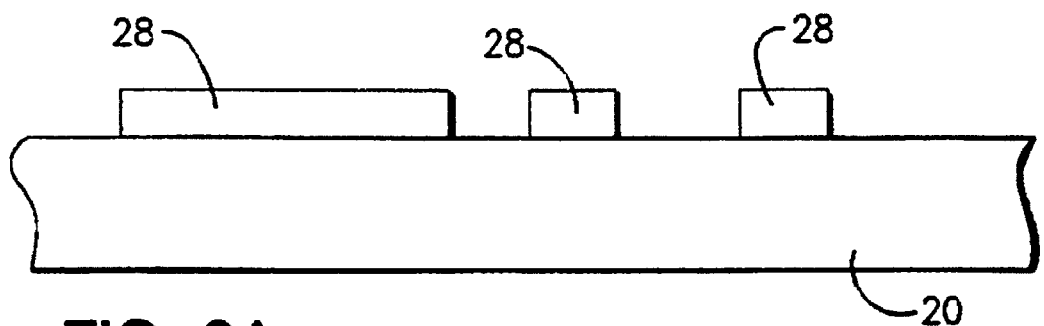
FIGS. 6A, 6B and 6C are schematic views illustrating a process of flattening the surface of an oxide film of metal wiring lines based on the conventional flattening polishing method.
Figure 6B:
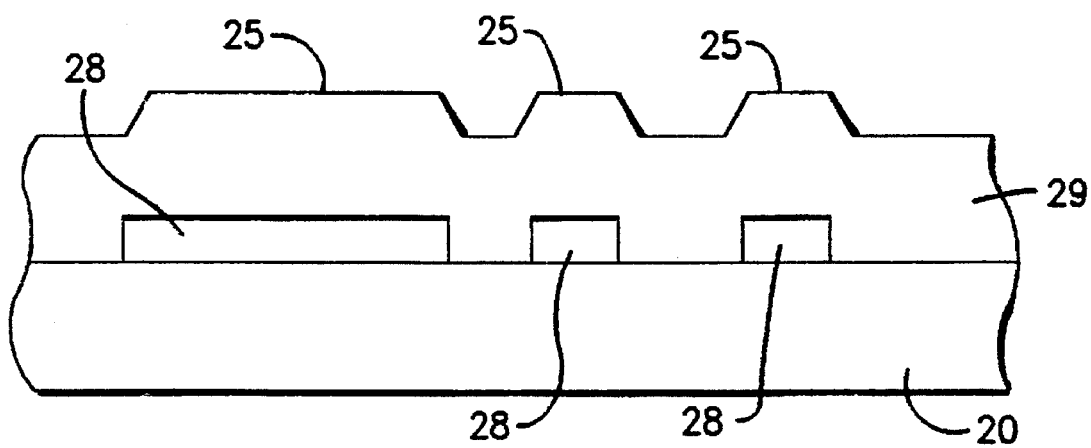
Figure 6C:
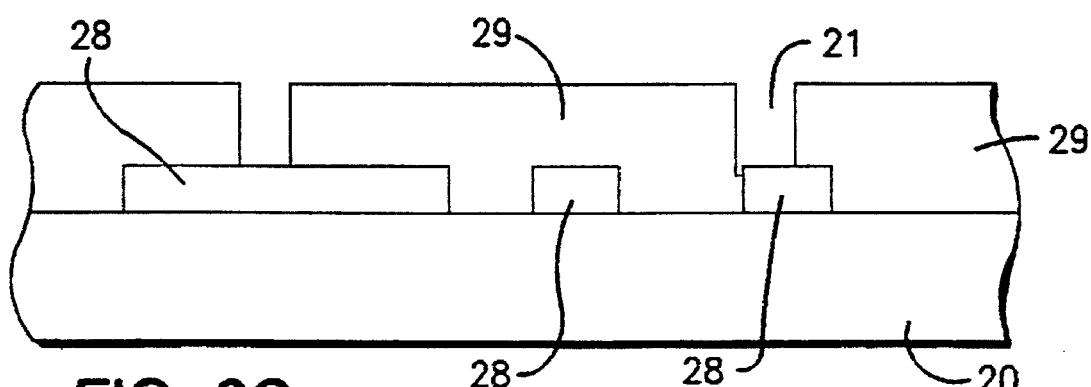
Figure 7A:
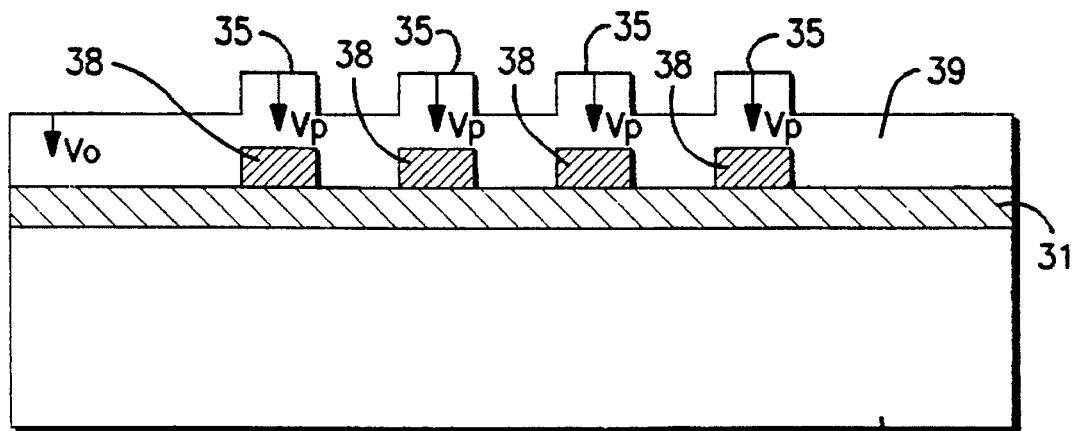
FIGS. 7A and 7B are schematic sectional views illustrating the first subject of the conventional flattening polishing method.
Figure 7B:
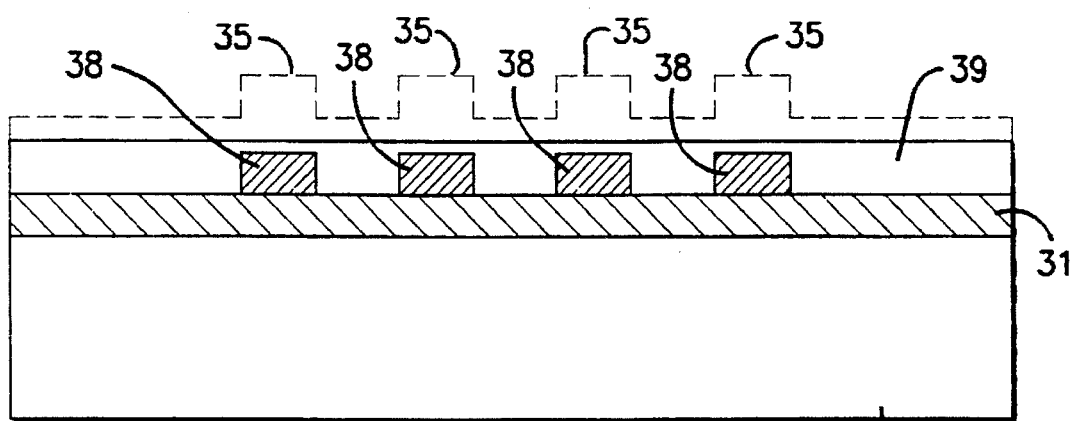
Figure 11:
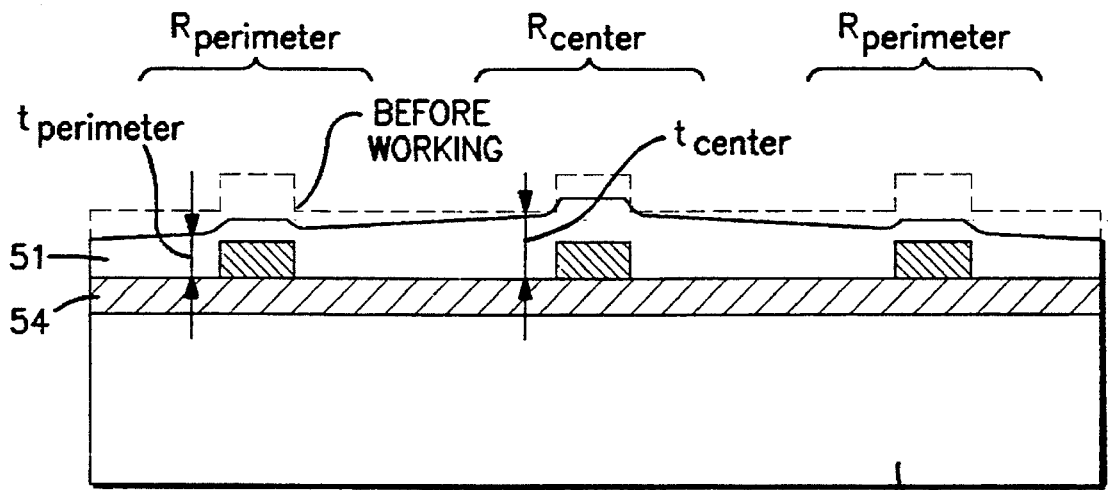
FIG. 11 is a schematic sectional view illustrating the second subject of the conventional flattening polishing method.
Figure 8:
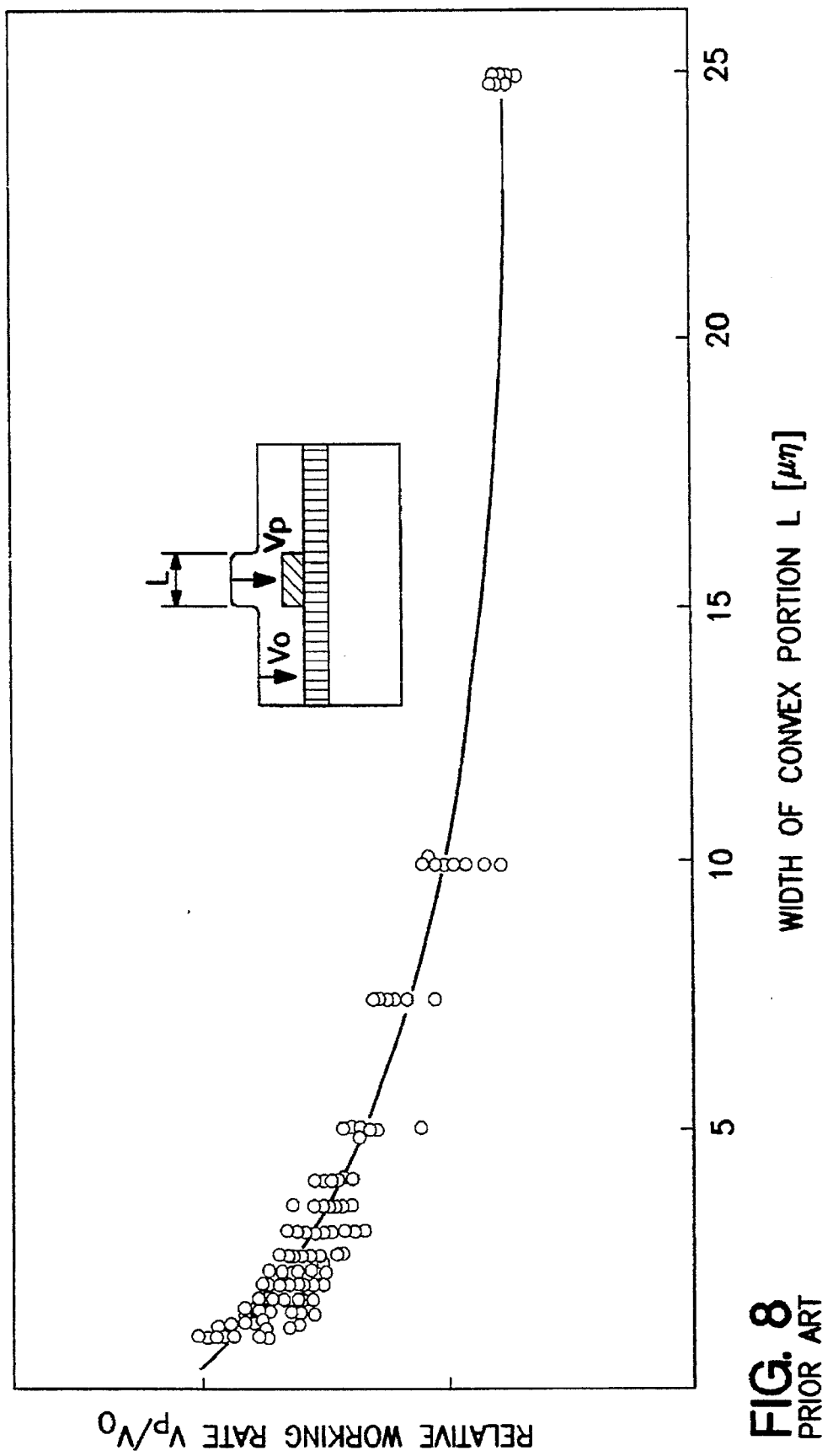
FIG. 8 is a graph showing the dependency of the relative working rate $V_P/V_O$ upon the width of a convex portion.
Figure 9A:
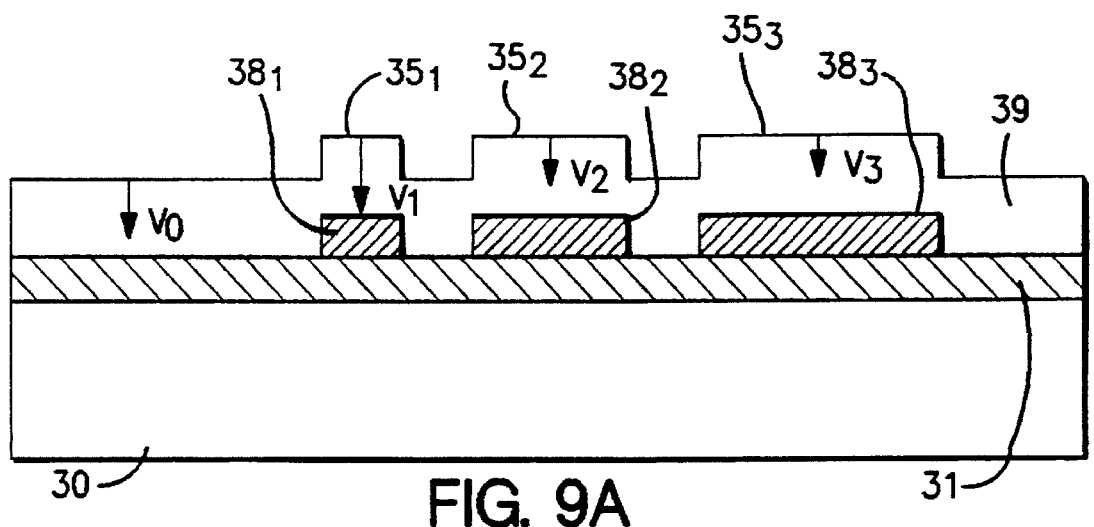
FIGS. 9A, 9B and 9C are schematic sectional views illustrating a flattening process based on the conventional flattening polishing method when convex portions have different sizes.
Figure 9B:
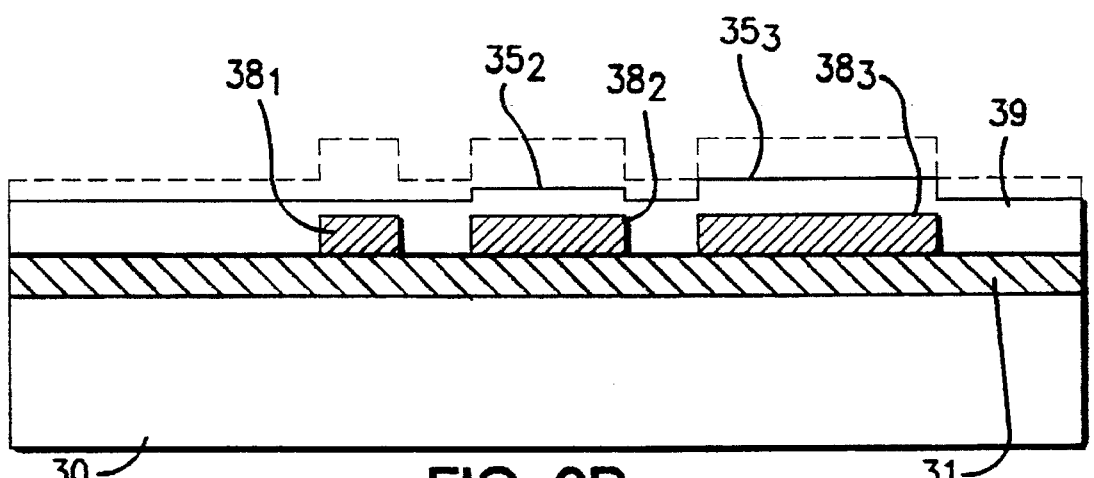
Figure 9C:
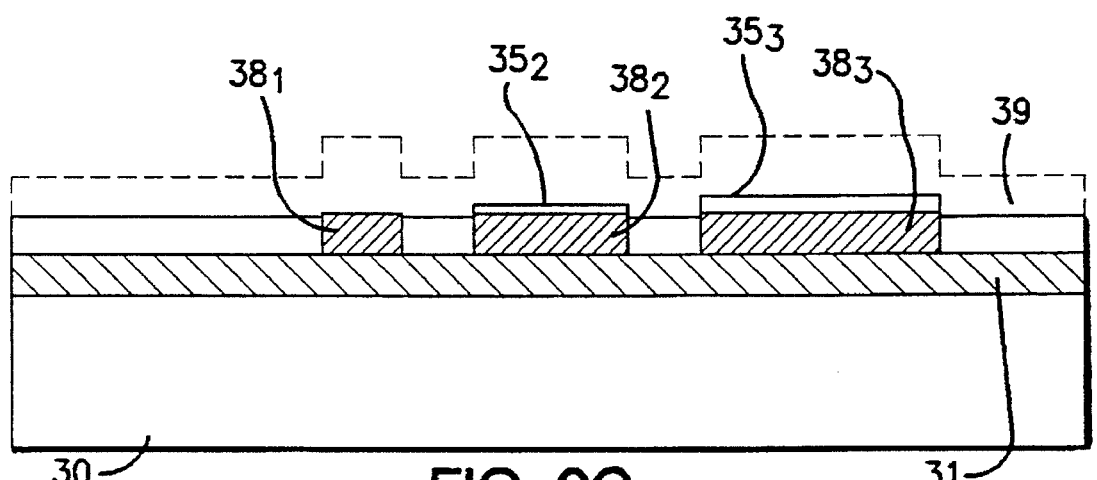
Figure 10:
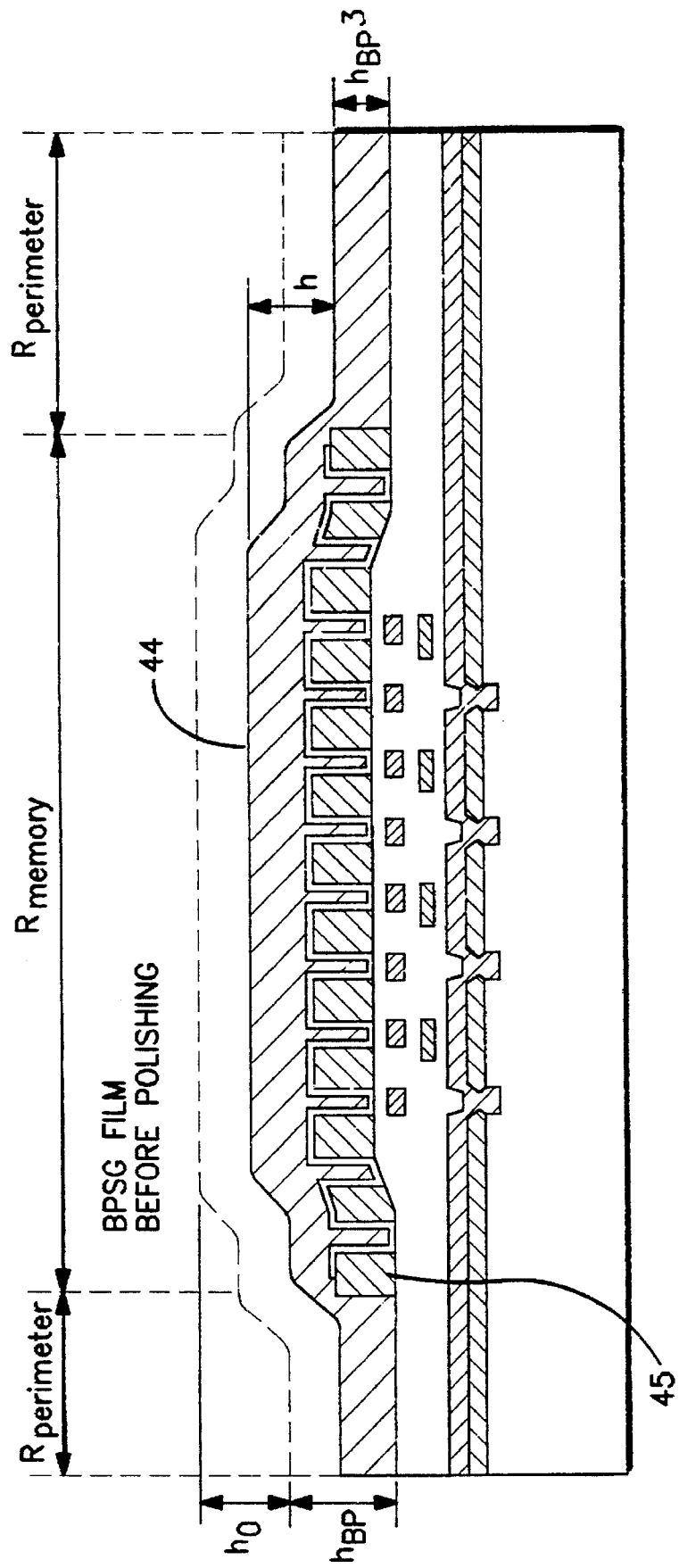
FIG. 10 is a schematic sectional view illustrating a problem when a 64 Mb DRAM is to be manufactured by the conventional flattening polishing method.
Figure 12:
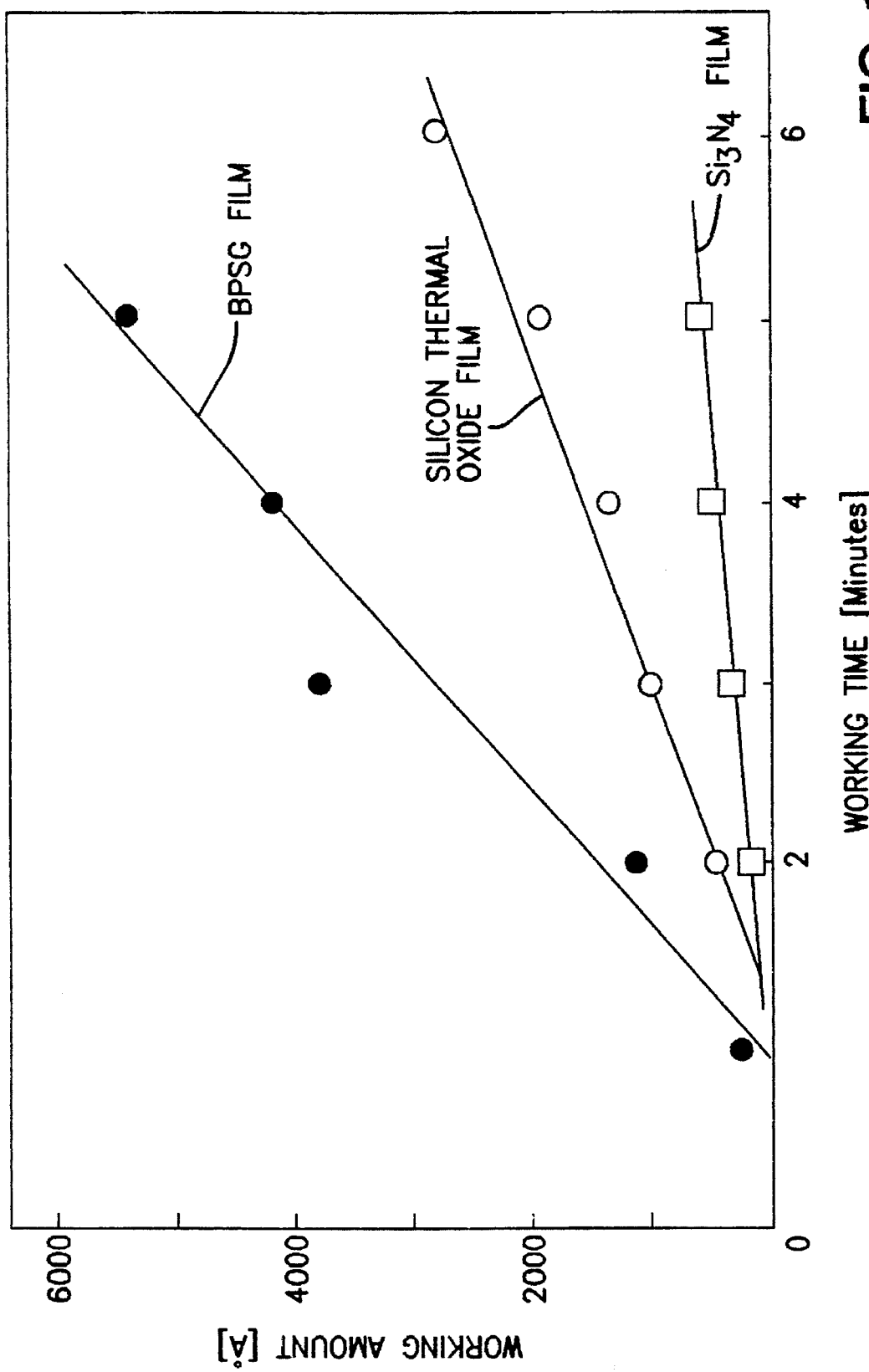
FIG. 12 is a graph showing the results of an experiment in which the relationship between the working time and the working amount is examined using a $Si_3N_4$ film, a silicon thermal oxide film and a BPSG film for an insulating film.
Figure 13:
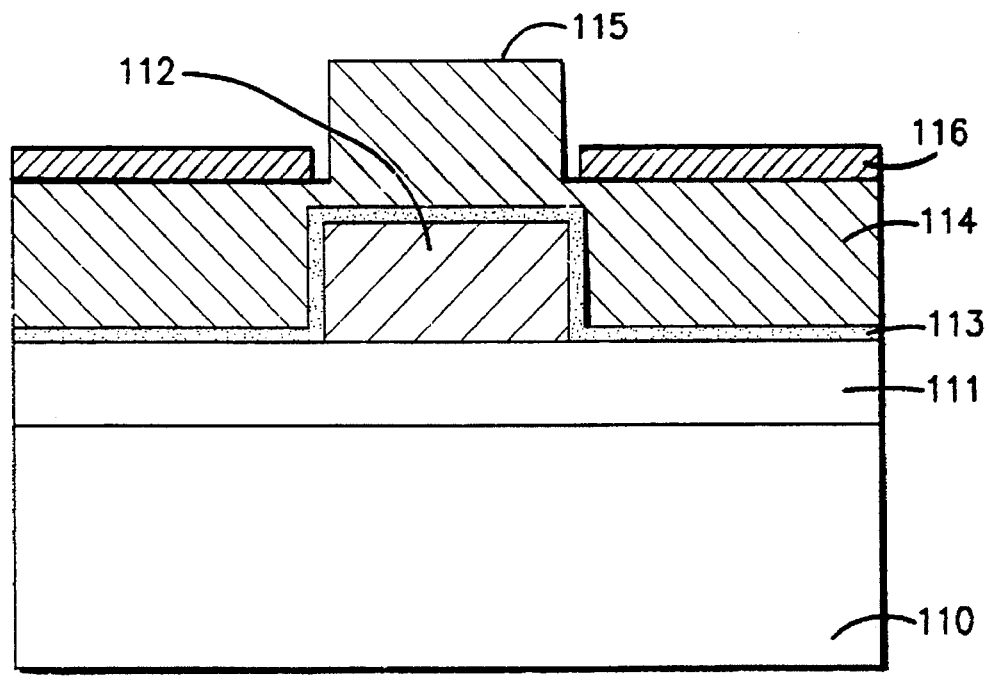
FIGS. 13 and 14 are schematic sectional views illustrating the principle of an embodiment of the surface flattening method according to the present invention.

An embodiment of a surface flattening method according to the present invention flattens the surface of an insulating film by taking advantage of the fact that the working rate varies depending upon the type of a material to be polished when polishing the surface of the insulating film through the use of colloidal silica slurry. As shown in FIG. 12, experimental results at the working pressure of 0.5 kg/cm² and the velocity of rotation of the polishing level block and the wafer of 35 rpm demonstrated that the relationship between the working time and the working amount, i.e. the working rate, is 150 Å per minute when a $Si_3N_4$ film formed by the low-pressure CVD method (the LP-CVD method) is used as the insulating film; 760 Å per minute when a silicon thermal oxide film is used as the insulating film; and 1,300 Å per minute when a BPSG film (after the reflow heat treatment at 850° C.) formed by the plasma CVD method is used as the insulating film. Accordingly, the working rate when using the $Si_3N_4$ film as the insulating film is about one eighth the working rate when using the BPSG film as the insulating film. The principle of the surface flattening method which makes use of the difference between the working rates of the BPSG film and the $Si_3N_4$ film is demonstrated by the case wherein, as shown in FIG. 13, following the formation of an underlying convex pattern 112 such as a polycrystalline silicon wiring layer over a silicon substrate 110 that includes a device layer 111 and the subsequent successive formation of a $SiO_2$ film 113 and a BPSG film 114 over the combined device layer 111 and the underlying convex pattern 112 by the CVD method, the convex portion 115 on the surface of the BPSG film 114 overlying the underlying convex pattern 112 is removed.

A $Si_3N_4$ film 116 is formed as a protective film over the BPSG film 114 by the low-pressure CVD method. The thickness of the $Si_3N_4$ film 116 to be formed is determined depending upon the relative working rate of the working rate of the BPSG film 114 to the working rate of the $Si_3N_4$ film 116 and the height of the convex portion 115 on the surface of the BPSG film 114. For example, when the working rate of the $Si_3N_4$ film 116 is about one eighth the working rate of the BPSG film 114 and the height of the convex portion 115 is 8,000 Å, the thickness of the $Si_3N_4$ film 116 will be 1,000 to 1,500 Å. Thereafter, the $Si_3N_4$ film 116 formed over the convex portion 115 on the surface of the BPSG film 116 is removed by photolithography and dry etching. The $Si_3N_4$ film 116 is removed over an area slightly larger than that of the convex portion 115 so that no $Si_3N_4$ film 116 will be left above the convex portion 115, as shown in FIG. 13.

Figure 14:
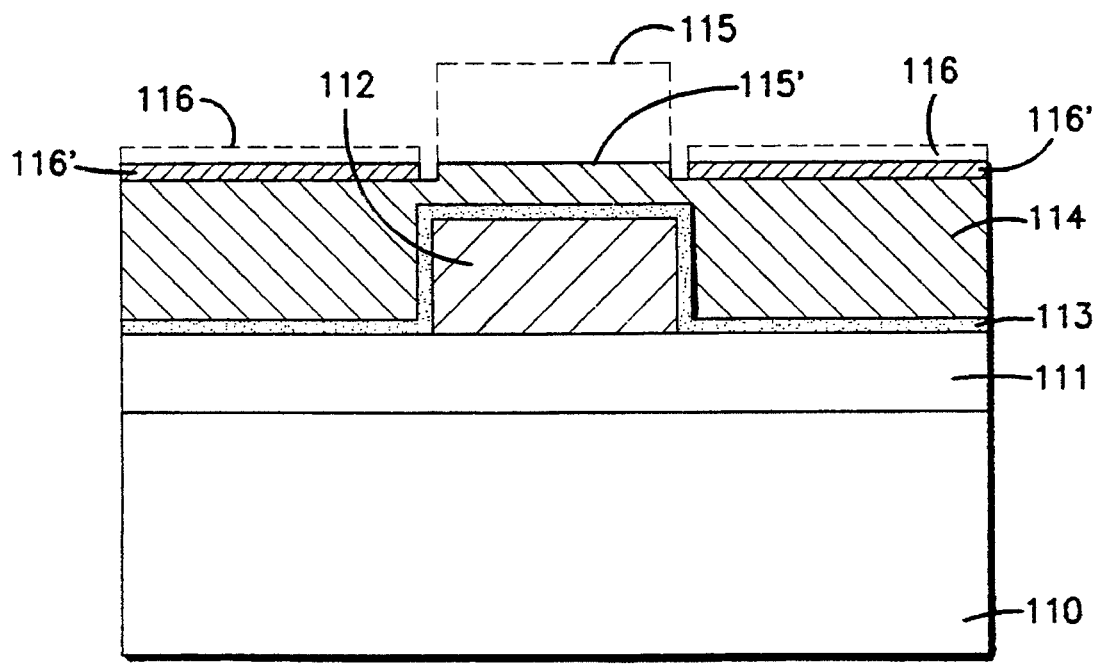

If the silicon substrate 110 is polished through the use of colloidal silica slurry, only the convex portion 115 from which the $Si_3N_4$ film 116 has been removed can be selectively removed by polishing, and the surface of the BPSG film 114 protected by the $Si_3N_4$ film 116 will not be removed by polishing, as shown in FIG. 14. After polishing, the $Si_3N_4$ film 116 is removed by etching and the surface of the BPSG film 114 is thereby effectively flattened.

Figure 15:
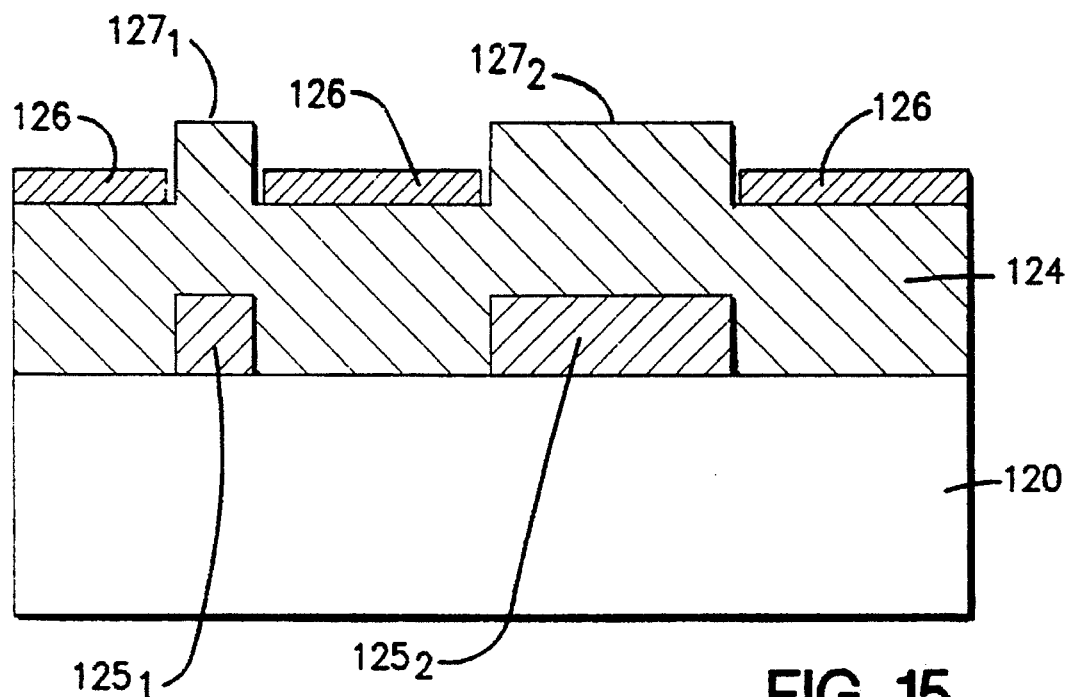
FIGS. 15 to 18 are schematic sectional views illustrating that the pattern size dependency of the flattening characteristics can be eliminated by a first example of the embodiment of the surface flattening method according to the present invention.

Next, a first example of the embodiment of the surface flattening method of the present invention will be described wherein a first underlying convex pattern $125_1$ having a small width and a second underlying convex pattern $125_2$ are formed over a silicon substrate 120 and a BPSG film 124 is formed over the silicon substrate 120 and the first and second underlying convex patterns $125_1$, $125_2$, as shown in FIG. 15. This flattening polishing method makes use of the difference between the working rates of the BPSG film and the $Si_3N_4$ film to avoid the problem that the flattening characteristics are dependent on the pattern size, the first subject of the conventional flattening polishing method. When the BPSG film 124 is formed, a small first convex portion $127_1$ and a large second convex portion $127_2$ are produced on the surface of the BPSG film 124.

Figure 16:
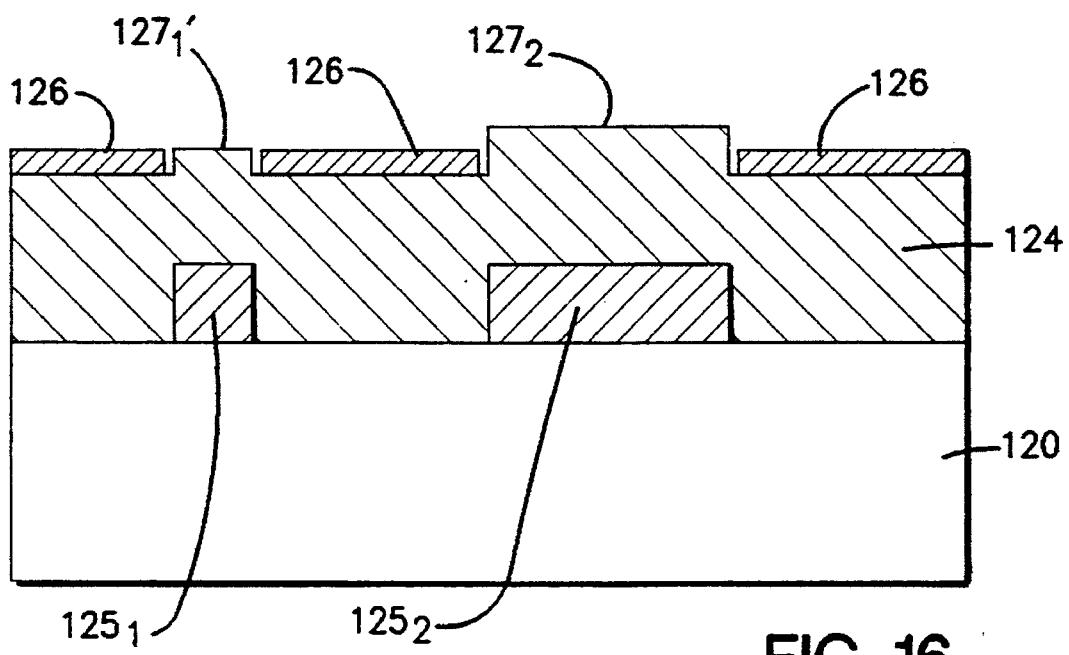
Figure 17:
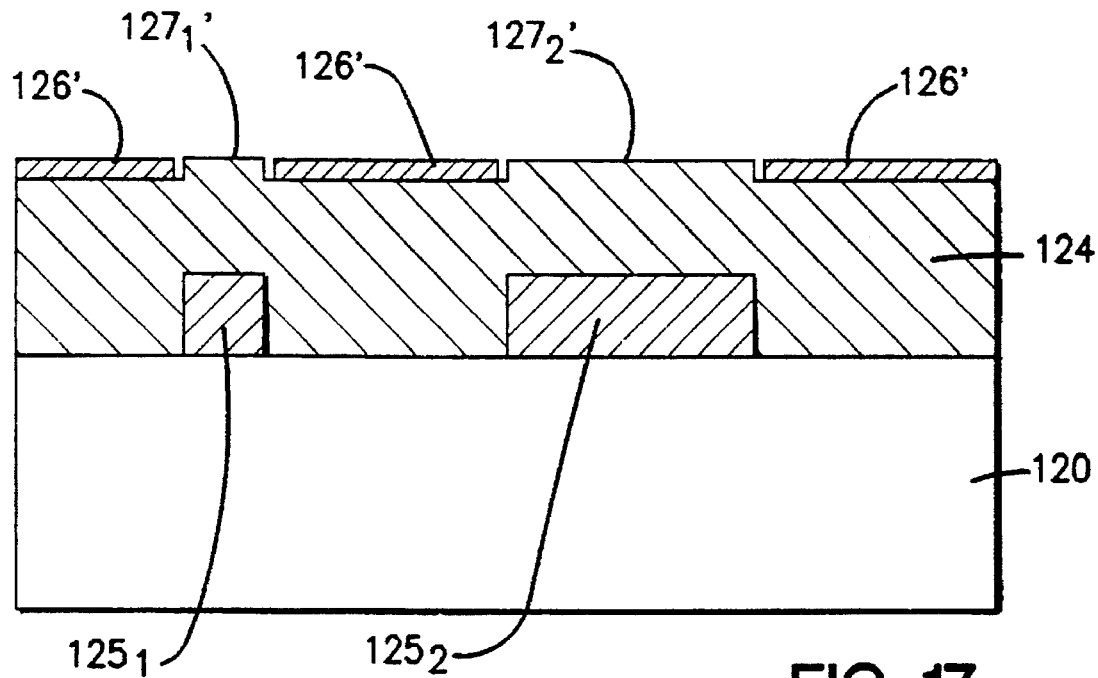
Figure 18:
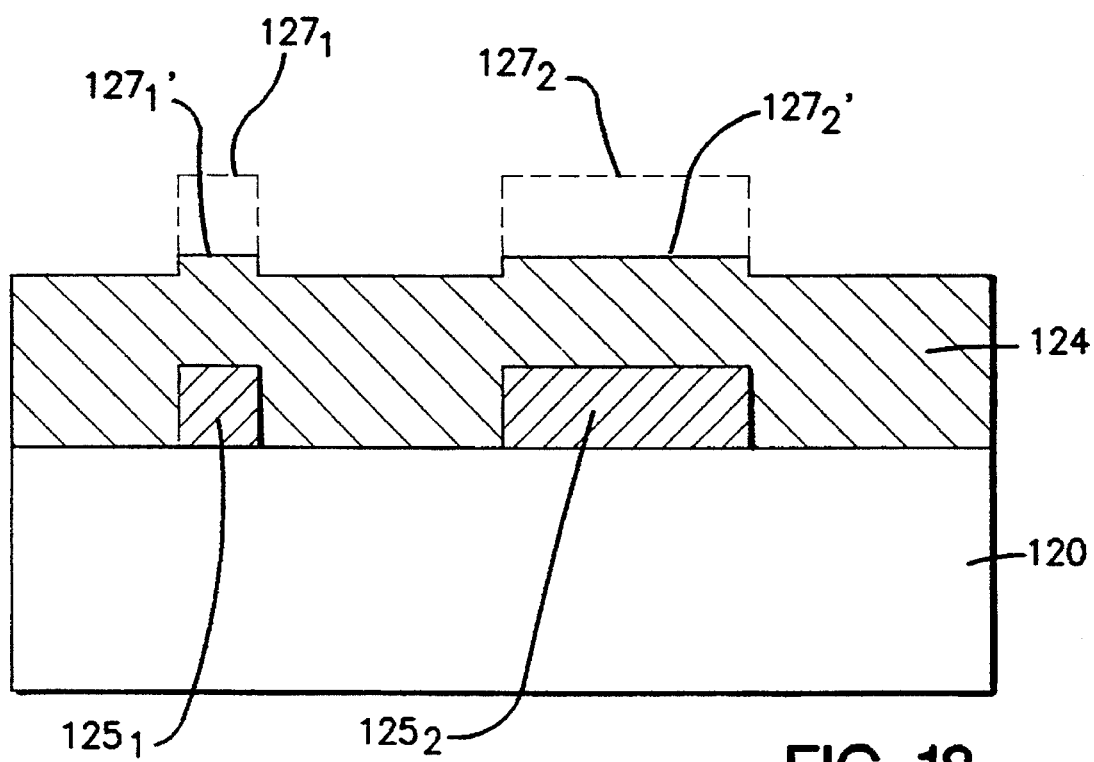

After forming a $Si_3N_4$ film 126 as a protective film on the BPSG film 124 by the low-pressure CVD method, the $Si_3N_4$ film 126 formed over the first and second convex portions $127_1$, $127_2$ of the surface of the BPSG film 124 is removed by photolithography and dry etching. As shown in FIG. 16, when the silicon substrate 120 is polished through the use of colloidal silica slurry, the first convex portion $127_1$ can be removed first because the working rate at the small first convex portion $127_1$ is higher than the working rate at the larger second convex portion $127_2$. As the polishing of the silicon substrate 120 proceeds, since the first convex portion after working $127_1'$ is surrounded by the $Si_3N_4$ film 126, only the second convex portion $127_2$ is removed, as shown in FIG. 17. As a result, after polishing, the $Si_3N_4$ film after working 126' is removed by etching to effectively flatten the surface of the BPSG film 124, as shown in FIG. 18. In this manner, according to the embodiment of the surface flattening method of the present invention, even when underlying convex patterns of different sizes are present, the surface of the insulating film can be uniformly flattened. It is to be noted that, in place of removing the $Si_3N_4$ film after working 126' by etching, the polishing may be continued to further remove the $Si_3N_4$ film after working 126'.

Figure 19:
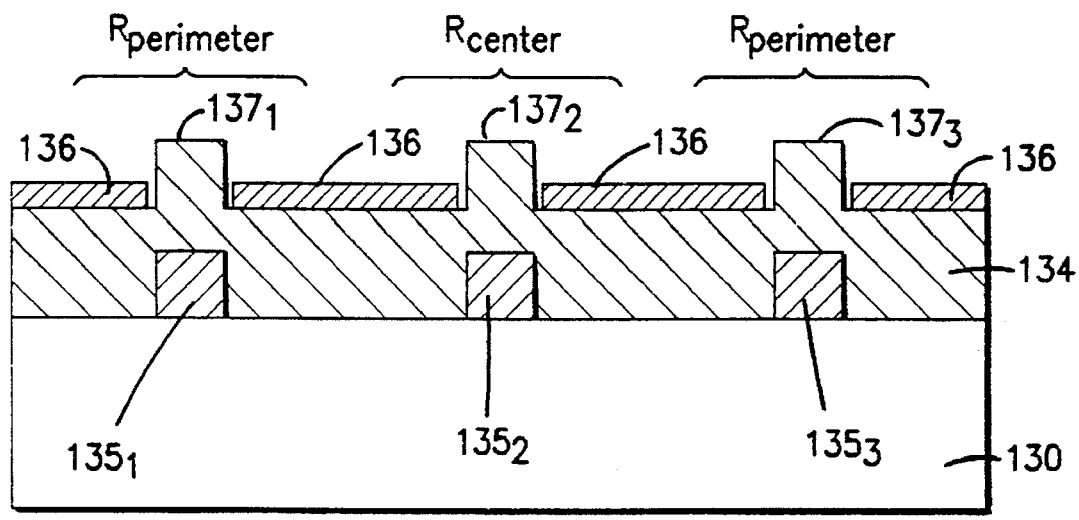
FIGS. 19 to 21 are schematic sectional views illustrating that the dispersion of the working amount of a substrate in its plane can be prevented by an embodiment of the surface flattening method according to the present invention.

Further, as shown in FIG. 19, it is demonstrated that a flattening polishing method which makes use of the difference between the working rates of the BPSG film and the $Si_3N_4$ film according to the embodiment of the surface flattening method of the present invention can prevent the dispersion of the working amount of a substrate in its plane, the second subject of the conventional flattening polishing method. In this example, first to third underlying convex patterns $135_1$–$135_3$ of equal size are formed over a silicon substrate 130 following which a BPSG film 134 is formed over the silicon substrate 130 and the first to third underlying convex patterns $135_1$–$135_3$. When the BPSG film 134 is formed, first to third convex portions $137_1$–$137_3$ of equal size are produced on the surface of the BPSG film 134.

Figure 20:
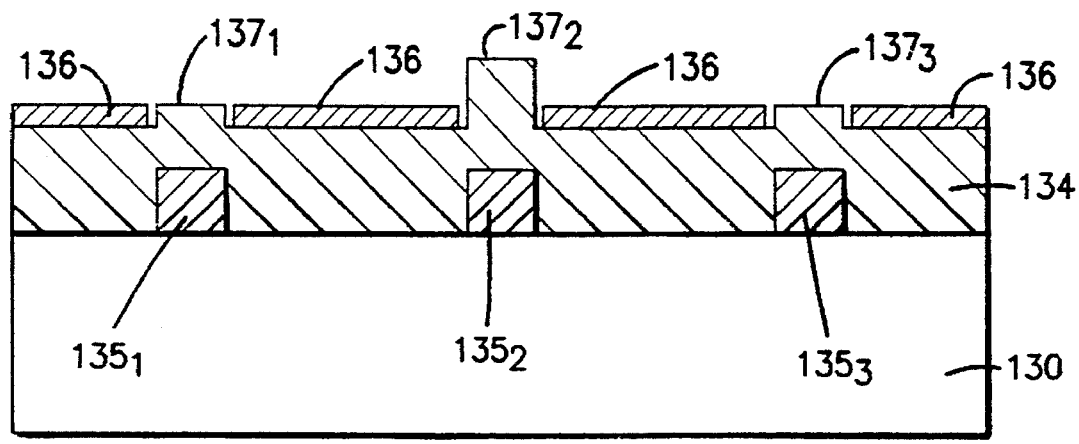
Figure 21:
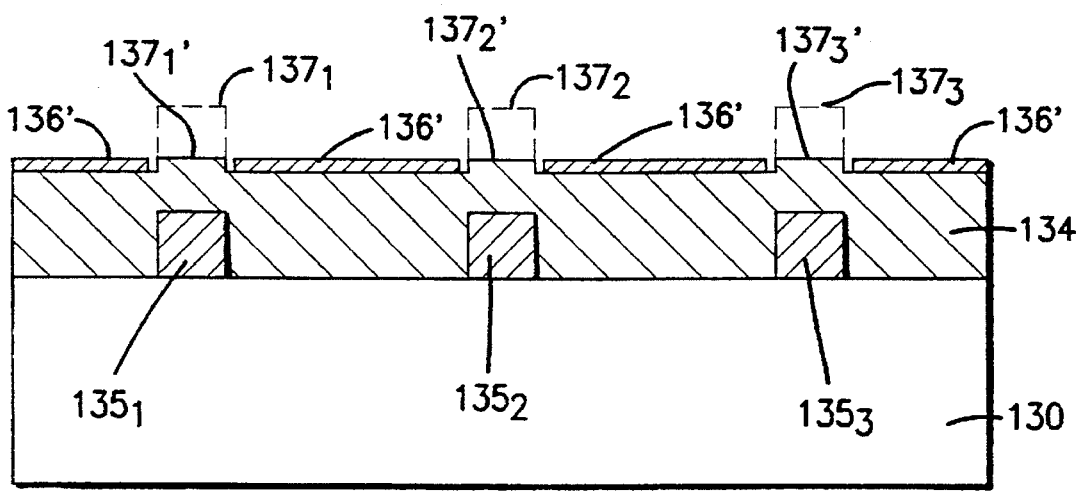

After forming the $Si_3N_4$ 136 film as the protective film on the BPSG film 134 by the low-pressure CVD method, the portion of $Si_3N_4$ film 136 overlying the first to third convex portions $137_1$–$137_3$ on the surface of the BPSG film 134 is removed by photolithography and dry etching. As shown in FIG. 20, when the silicon substrate 130 is polished through the use of colloidal silica slurry, the first and third convex portions $137_1$, $37_3$ in perimetric areas $R_{perimeter}$ can be removed prior to the second convex portion $137_2$ in a central area $R_{center}$ since the working rate in the perimetric areas $R_{perimeter}$ is higher than the working rate in the central area $R_{center}$, as hereinafter described. As the polishing is continued further, since the first and third convex portions after working $137_1'$, $137_3'$ are surrounded by the $Si_3N_4$ film 136, only the second convex portion $137_2$ is removed as shown in FIG. 21. As a result, after polishing, the $Si_3N_4$ film after working 136' is removed by etching, thereby effectively flattening the surface of the BPSG film 134. In this manner, according to the embodiment of the surface flattening method of the present invention, since the dispersion of the working amount of the substrate in its plane can be prevented, the surface of the insulating surface can be flattened uniformly. It is to be noted that, in place of removing the $Si_3N_4$ film after working 136' by etching, the polishing may be further continued to remove the $Si_3N_4$ film after working 136'.

Next, it will be demonstrated that the flattening polishing method which makes use of the difference between the working rates of the BPSG film and the $Si_3N_4$ film according to the embodiment of surface flattening method of the present invention can also prevent the metal pollution of the device layer, the third subject of the conventional flattening polishing method.

Since the BPSG film has a gettering effect on metal (Kern et al., "Borophosphosilicate Glasses for Integrated Circuits", *Solid State Technology*, June 1985, p. 171), the use of the BPSG film as an insulating film as shown in FIGS. 13, 15 and 19 can prevent the shift of the threshold voltage of a MOSFET which may be caused by the penetration of alkali metal or transition metal through the insulating film. It is to be noted that the gettering effect of the embedded BPSG film can obviously be used even when the surface flattening method is used to flatten the surface of a $SiO_2$ film having the BPSG film embedded as a ground.

It should also be noted that, when a $SiO_2$ film, a BSG film, a PSG film or a layered film made up of these films is used as the insulating film in place of the BPSG film, similar effects can be obtained. It is only necessary that the protective film have a higher hardness and be worked at a lower working rate than the insulating film to be polished. In addition to the $Si_3N_4$ film, an alumina film ($Al_2O_3$ film), a titanium nitride film (TiN film) or a diamond film may be employed as the protective film, as can a multilayer film wherein a $Si_3N_4$ film, an alumina film, a titanium nitride film or a diamond film is formed over an insulating film. As an additional note, the BPSG film need not necessarily be reflowed.

An example wherein the flattening polishing method according to the present invention is applied to a manufacturing step of a DRAM will next be described.

Figure 22:
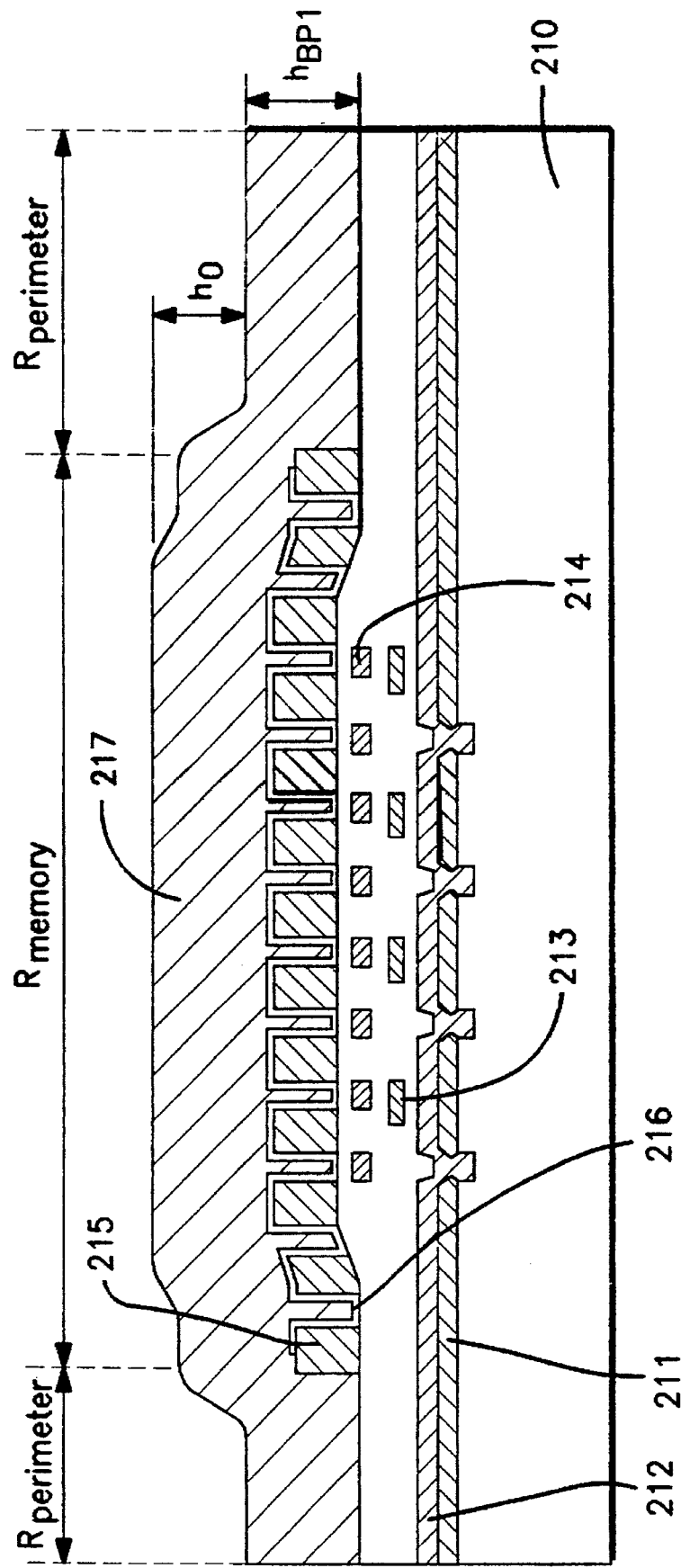
FIGS. 22 and 23 are schematic sectional views illustrating an example wherein the flattening polishing method according to the present invention is applied to a manufacturing step of a DRAM.
Figure 23:
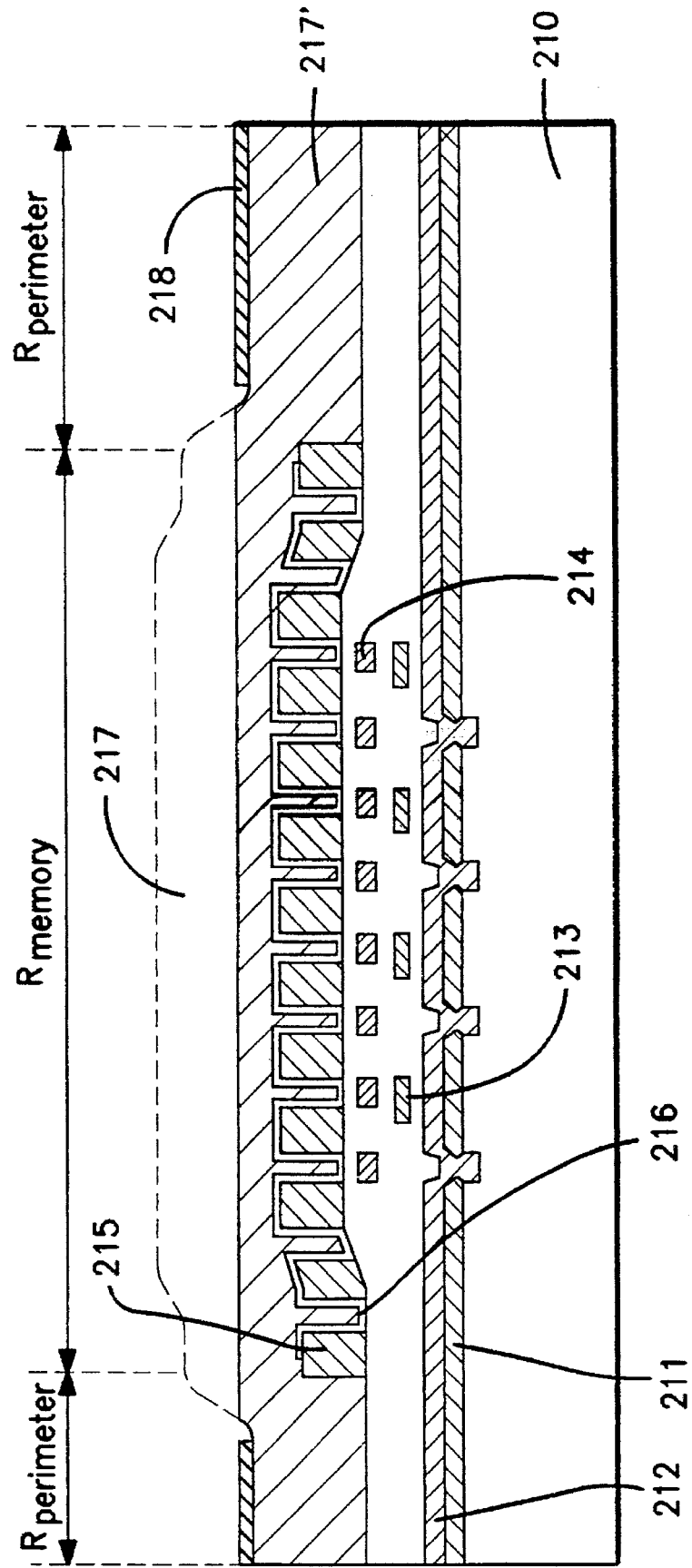

An element-separating oxide film 211, a gate electrode wiring line 212 which functions as a word line, local polysilicon interconnecting lines (interconnects) 213, polyside interconnecting lines (interconnects) 214 which function as bit lines, polycrystalline silicon stacked capacitors 215 and a capacitor plate polycrystalline silicon wiring line 216 are successively formed over a silicon substrate 210. Thereafter, a BPSG film 217 having a film thickness $h_{Bp1}$ of 10,000 to 12,000 Å is formed and reflowed. At this point in the process, as shown in FIG. 22, the BPSG film 217 in a memory cell area $R_{memory}$, in which the polycrystalline silicon stacked capacitors 215 are concentrated, is swollen by 8,000 to 10,000 Å from the BPSG film 217 in perimetric circuit areas $R_{perimeter}$. Accordingly, at the boundary between the memory cell area $R_{memory}$ and the perimetric circuit area $R_{perimeter}$, an offset of height $h_O$ is produced on the surface of the BPSG film 217. After the $Si_3N_4$ film 218 of 1,000 to 1,500 Å thick is formed over the BPSG film 217, the $Si_3N_4$ film 218 in the memory cell area $R_{memory}$ is removed, and the silicon substrate 210 is polished. In this instance, only the BPSG film 217 in the memory cell area $R_{memory}$ is selectively removed, as shown in FIG. 23. The $Si_3N_4$ film 218 in the perimetric circuit areas $R_{perimeter}$ is removed, thereby obtaining the BPSG film after working 217' which has a flattened surface over the entire area of the silicon substrate 210. It is to be noted that, since the BPSG film 217 in the perimetric circuit areas $R_{perimeter}$ is not worked due to the presence of the $Si_3N_4$ film, the film thickness $h_{BP1}'$ of the BPSG film after working 217' in the perimetric circuit areas $R_{perimeter}$ is as great as 8,000 to 12,000 Å. Accordingly, the film thickness of the BPSG film after working 217' may be reduced by removing, after the removal of the $Si_3N_4$ film 218, the surface of the BPSG film after working 217' over the entire area of the silicon substrate 210 by the etching or the ordinary polishing. Further, the BPSG film 217 need not necessarily be reflowed.

Next, another example wherein the flattening polishing method according to the present invention is applied to a manufacturing step of a DRAM will be described.

Figure 24:
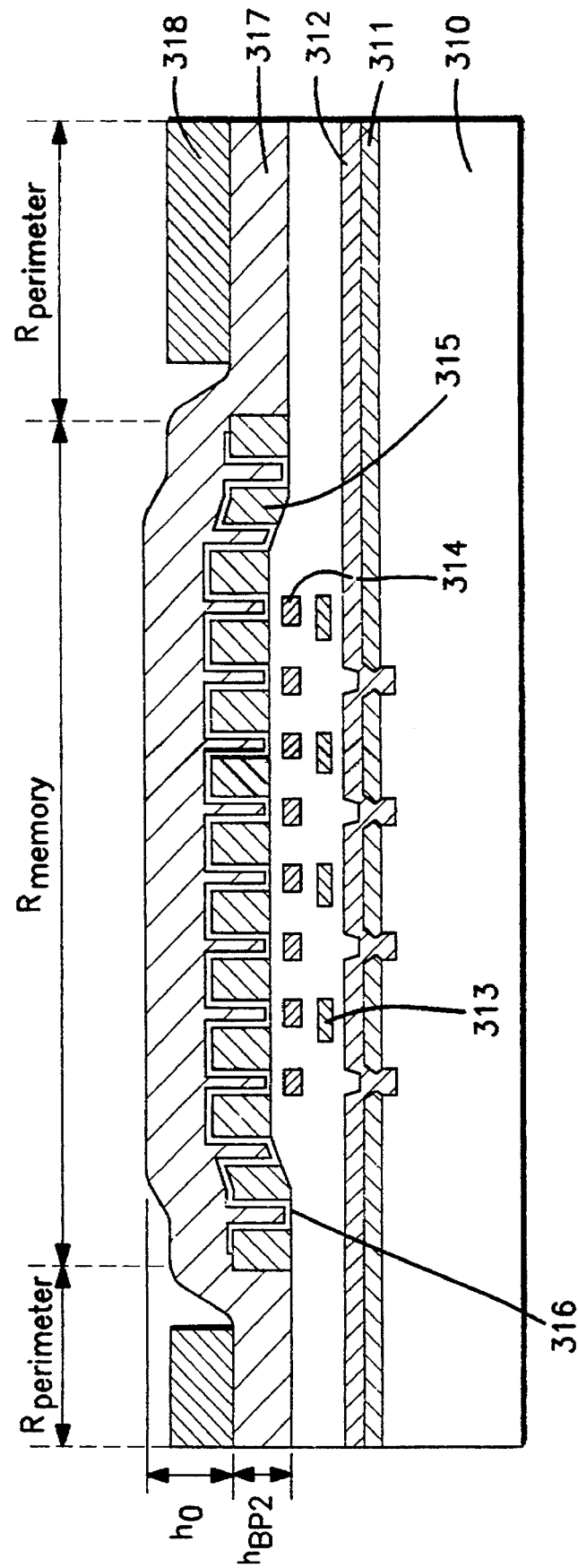
FIGS. 24 and 25 are schematic sectional views illustrating another example wherein the flattening polishing method according to the present invention is applied to a manufacturing step of a DRAM.
Figure 25:
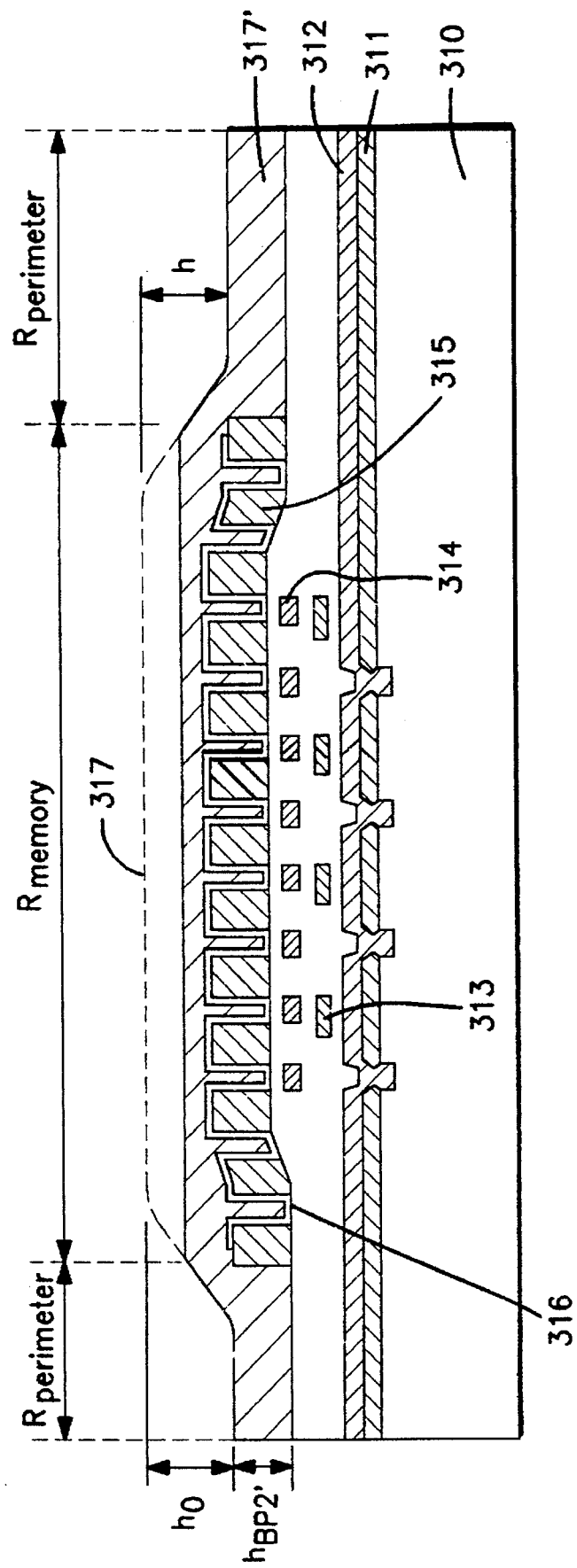

In the present example, a BPSG film 317 to be formed over the entire area of a silicon substrate 310 is as thin as 6,000 to 8,000 Å, as shown in FIG. 24, and consequently, the film thickness $h_{BP2}$ of the BPSG film 317 in perimetric circuit areas $R_{perimeter}$ is not very great. To this end, a $Si_3N_4$ film 318 having the thickness of 2,000 to 3,000 Å, which is thicker than the $Si_3N_4$ film 218 shown in FIG. 22, is formed over the BPSG film 317 in the perimetric circuit areas $R_{perimeter}$. The BPSG film 317 in a memory cell area $R_{memory}$ is selectively removed by polishing, following which the $Si_3N_4$ film 318 is removed, as shown in FIG. 25. As a result, the initial offset of height $h_O$ (8,000 to 10,000 Å), which was produced on the BPSG film 317 at the boundary between the memory cell area $R_{memory}$ and the perimetric circuit area $R_{perimeter}$, is reduced to an offset of height h (2,000 to 3,000 Å). Further, the film thickness $h_{BP2}'$ of the BPSG film 317' in the perimetric circuit areas $R_{perimeter}$ after working is 6,000 to 8,000 Å. It is to be noted that the protective film may be a multilayer film wherein a $Si_3N_4$ film 1,500 Å thick is layered on a polysilicon film 1,500 Å thick.

As can be understood from the two examples described above, it is important to suitably vary the film thickness of the BPSG film to be flattened and the film thickness of the $Si_3N_4$ film serving as the polishing film in accordance with the allowable value of the film thickness of the BPSG film in the memory cell area $R_{memory}$, the allowable value of the film thickness of the BPSG film in the perimetric circuit areas $R_{perimeter}$ and the allowable value of the offset between the memory cell area $R_{memory}$ and the perimetric circuit area $R_{perimeter}$.

In the two examples described above, the polishing is performed after removing the protective film (the $Si_3N_4$ film) in the memory cell area $R_{memory}$. However, if the protective film (the $Si_3N_4$ film) which is positioned just above at least one gate electrode wiring line and polyside wiring line in the perimetric circuit areas $R_{perimeter}$ is also removed before carrying out the polishing step, the convex portions on the surface of the BPSG film which are caused by the presence of the gate electrode wiring line and the polyside wiring line in the perimetric circuit areas $R_{perimeter}$ can also be removed simultaneously while the BPSG film in the memory cell area $R_{memory}$ is removed by the flattening polishing method according to the present invention. Further, while the BPSG film is polished after it is reflowed in the two examples described above, it may be reflowed after polishing.

Next, an example wherein the flattening polishing method according to the present invention is applied to a step of forming a three-layer aluminum wiring line will be described.

Figure 26:
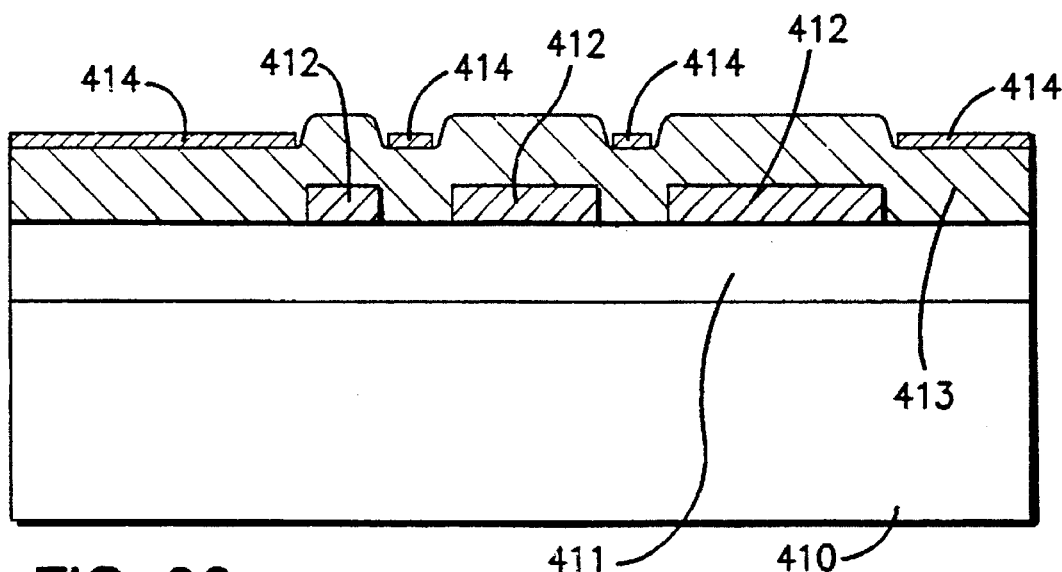
FIGS. 26 to 29 are schematic sectional views illustrating an example wherein the flattening polishing method according to the present invention is applied to a step of forming three-layer aluminum wiring lines.
Figure 27:
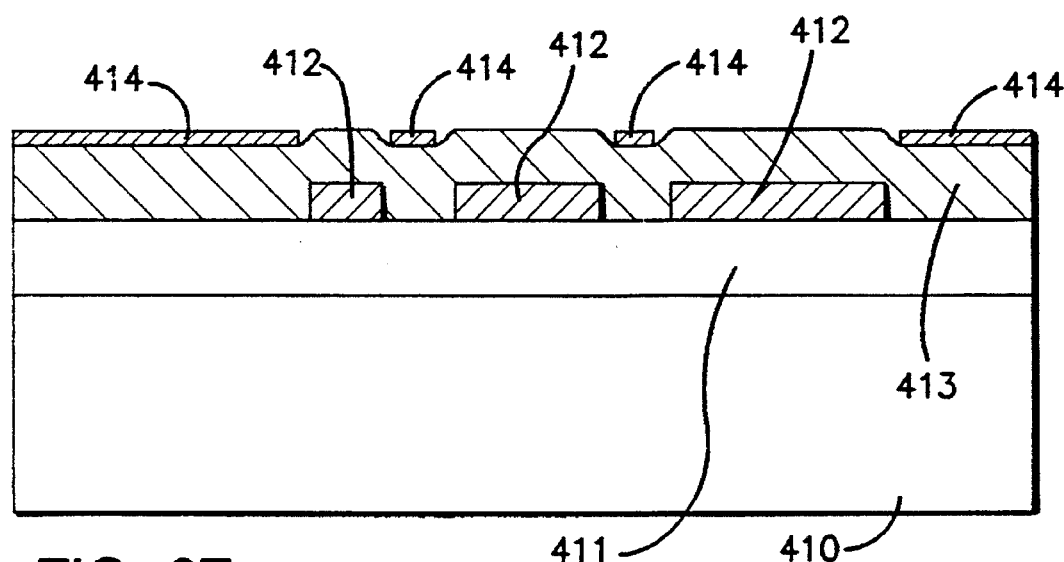

In the present example, after successively forming a $SiO_2$ film 411 and first layer aluminum wiring lines 412 over a silicon substrate 410, a first interlayer insulating film 413 made of $SiO_2$ is formed over the $SiO_2$ film 411 and the first layer aluminum wiring lines 412 by the plasma CVD method, as shown in FIG. 26. In this instance, convex portions are produced on the surface of the first interlayer insulating film 413. Thereafter, a first $Si_3N_4$ film 414 serving as the protective film is formed over the first interlayer insulating film 413. Thereafter, the first $Si_3N_4$ film 414 formed at the portions of the first interlayer insulating film 413 at the convex portions is removed. The silicon substrate 410 is polished so that the surface of the first interlayer insulating film 413 is effectively flattened, as shown in FIG. 27.

Figure 28:
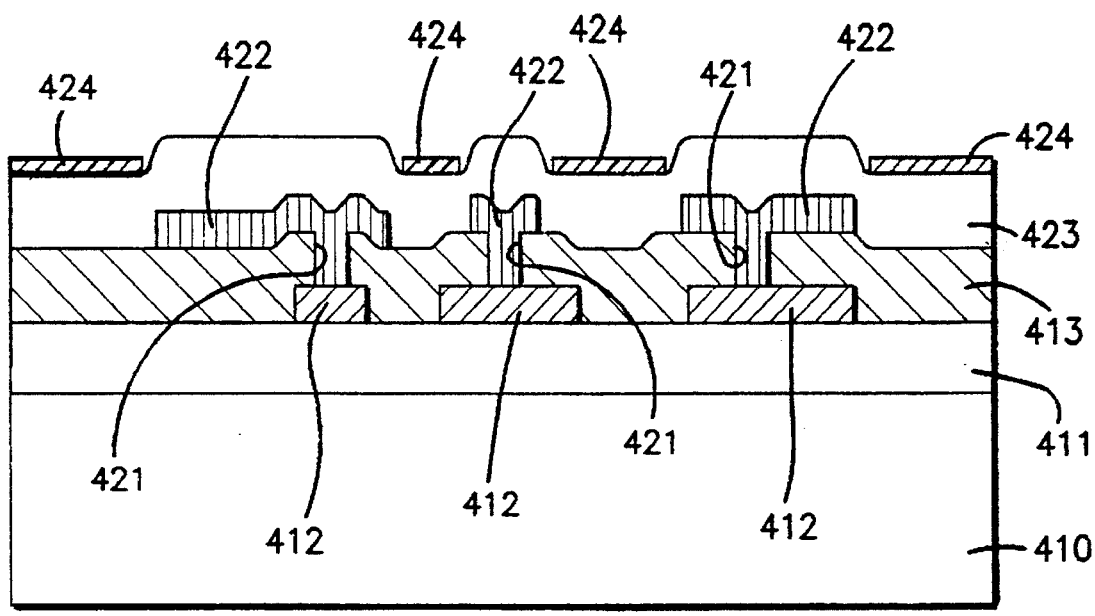

After the first $Si_3N_4$ film 413 is removed, first via holes 421 are formed in the first interlayer insulating film 413, and second layer aluminum wiring lines 422 are formed over the first interlayer insulating film 413, as shown in FIG. 28. Thereafter, a second interlayer insulating film 423 is formed over the first interlayer insulating film 413 and the second layer aluminum wiring lines 422. In this instance, convex portions are produced on the surface of the second interlayer insulating film 423. Thereafter, a second $Si_3N_4$ film 424 serving as the protective film is formed over the second interlayer insulating film 423, following which the second $Si_3N_4$ film 424 formed at portions of the second interlayer insulating film 423 at the convex portions is removed. Finally, the silicon substrate 410 is polished, thereby flattening the surface of the second interlayer insulating film 423.

Figure 29:
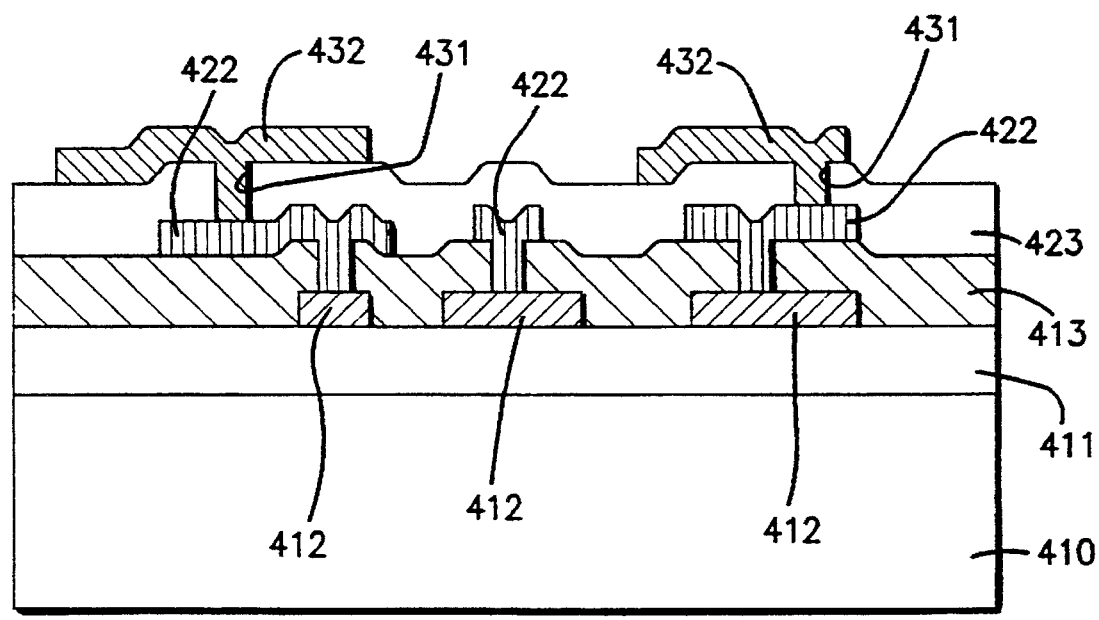

After the second $Si_3N_4$ film 423 is removed, second via holes 431 are formed in the second interlayer insulating film 423 and third layer aluminum wiring lines 432 are formed over the second interlayer insulating film 423, as shown in FIG. 29.

Although $SiO_2$ films formed by the plasma CVD method are used in the present example for each of the first and second interlayer insulating films 413, 423, the above-described BPSG film having a gettering effect may also be used as the interlayer insulating film. For more practical use, an insulating film having the structure wherein a BPSG gettering layer is embedded below a $SiO_2$ film formed by the plasma CVD method may be used as the interlayer insulating layer. By using a gettering layer such as a BPSG film as the interlayer insulating film when multilayer wiring lines are to be formed, variations in the threshold voltage of a MOSFET can be suppressed. Further, while aluminum wiring lines are used in the example described above, aluminum-containing wiring lines of Al—Si, Al—Si—Cu or Al—Ge, polycrystalline silicon wiring lines, polyside wiring lines or copper wiring lines may be employed instead. Further, while the flattening polishing method according to the present invention is applied to a step of forming three-layer aluminum wiring lines in the example described above, the method may also be applied to a forming step of wiring lines of more than three layers by repeating the steps described above.

While this invention has been described in conjunction with preferred embodiments thereof, it will now be possible for one skilled in the art to easily put this invention into practice in various other manners.

What is claimed is:

1. A method of manufacturing a semiconductor memory, comprising:

a step of forming a BPSG film over a semiconductor substrate having a memory cell area in which stacked capacitor cells are concentrated and over another perimetric circuit area in which said stacked capacitor cells are not concentrated, said BPSG film being formed to a greater height than said memory cell area;

a step of reflowing the BPSG film;

a step of covering all areas of the BPSG film other than those overlying the memory cell area with a deposited protective film which is lower in polishing rate than the BPSG film, said deposited protective film being thinner than a thickness of the stacked capacitor cells;

a step of polishing the surface of the BPSG film through the use of colloidal silica slurry; and a step of removing said deposited protective film after said polishing step.

2. A method of manufacturing a semiconductor memory as claimed in claim 1, wherein the protective film is a $Si_3N_4$ film.

3. A method of manufacturing a semiconductor device comprising the steps of:

covering a semiconductor substrate having a convex pattern with an insulating layer, said insulating layer thereby having a surface including a convex portion formed to a greater height than said convex pattern and perimetric concave portions around said convex portion;

forming a protection insulating film on said convex and perimetric portions;

selectively removing said protection insulating film from said convex portion;

selectively removing, by polishing, said insulating layer from said convex portion; and removing said protection insulating film from said perimetric portions.

4. The method according to claim 3, wherein said insulating layer is a BPSG film.

5. The method according to claim 3, wherein said protection insulating film is an $Si_3N_4$ film layered on a polysilicon film.

6. The method according to claim 3, wherein said insulating layer is reflowed before said protection insulating film is deposited thereon.

7. The method according to claim 3, wherein said insulating layer is reflowed after said protection insulating film is removed from said perimetric portions.

8. A method of manufacturing a semiconductor device comprising the steps of:

covering a semiconductor substrate having a convex pattern with an insulating layer formed to a greater height than said convex pattern, said insulating layer thereby having a surface including a convex portion and perimetric concave portions around said convex portion;

depositing, by a CVD method, a protection insulating film on a surface of said insulating layer covered convex and perimetric portions;

selectively removing said protection insulating film from said convex portion;

selectively removing, by polishing, said insulating layer from said convex portion; and removing said protection insulating film from said perimetric portions, a deposition of said protection insulating film by said CVD method thereby allowing a precise control of a thickness of said protection insulating film on said insulating layer.

9. The method according to claim 8, wherein said insulating layer is a BPSG film.

10. The method according to claim 8, wherein said protection insulating film is an $Si_3N_4$ film layered on a polysilicon film.

11. The method according to claim 8, wherein said insulating layer is reflowed before said protection insulating film is deposited thereon.

12. The method according to claim 8, wherein said insulating layer is reflowed after said protection insulating film is removed from said perimetric portions.

* * * * *